United States Patent
Takahara et al.

(10) Patent No.: US 11,482,999 B2
(45) Date of Patent: Oct. 25, 2022

(54) CAPACITIVE SENSOR AND METHOD OF MANUFACTURING THE SAME

(71) Applicants: Panasonic Intellectual Property Management Co., Ltd., Osaka (JP); SEIREN CO., LTD., Fukui (JP)

(72) Inventors: Wataru Takahara, Osaka (JP); Toshinori Sasaji, Fukui (JP)

(73) Assignees: PANASONIC INTELLECTUAL PROPERTY MANAGEMENT CO., LTD., Osaka (JP); SEIREN CO., LTD., Fukui (JP)

(*) Notice: Subject to any disclaimer, the term of this patent is extended or adjusted under 35 U.S.C. 154(b) by 339 days.

(21) Appl. No.: 16/932,367

(22) Filed: Jul. 17, 2020

(65) Prior Publication Data
US 2021/0028784 A1    Jan. 28, 2021

(30) Foreign Application Priority Data

| Jul. 23, 2019 | (JP) | JP2019-135006 |
| Jul. 23, 2019 | (JP) | JP2019-135032 |
| Nov. 15, 2019 | (JP) | JP2019-206732 |
| Mar. 26, 2020 | (JP) | JP2020-055778 |

(51) Int. Cl.
| G01R 27/26 | (2006.01) |
| H03K 17/96 | (2006.01) |
| B62D 1/04 | (2006.01) |
| G01D 5/24 | (2006.01) |
| B60R 21/015 | (2006.01) |
| B60N 2/00 | (2006.01) |

(52) U.S. Cl.
CPC .......... *H03K 17/962* (2013.01); *B60N 2/002* (2013.01); *B60R 21/01532* (2014.10); *B60R 21/01552* (2014.10); *B62D 1/046* (2013.01); *G01D 5/24* (2013.01); *H03K 17/9622* (2013.01); *H03K 2017/9602* (2013.01); *H03K 2217/960755* (2013.01)

(58) Field of Classification Search
USPC ................. 324/658, 660–663, 679; 200/600
See application file for complete search history.

(56) References Cited

U.S. PATENT DOCUMENTS

| 2015/0369633 A1 | 12/2015 | Karasawa et al. |
| 2018/0329535 A1* | 11/2018 | Vallett ............ H03K 17/962 |
| 2019/0003877 A1* | 1/2019 | Aina ............... B60N 2/002 |

FOREIGN PATENT DOCUMENTS

| JP | 5947919 | 7/2016 |
| JP | 2018-206776 | 12/2018 |
| WO | 2014/123222 | 8/2014 |

* cited by examiner

*Primary Examiner* — Vincent Q Nguyen
(74) *Attorney, Agent, or Firm* — Greenblum & Bernstein, P.L.C.

(57) ABSTRACT

A capacitive sensor includes: a substrate that is in the form of a sheet; and a sensor electrode that is capacitive and disposed on a frontside of the substrate. The sensor electrode is a conductive fabric made by applying a metal plating on a mesh fabric that is woven of a plurality of warps and a plurality of wefts and that has openings each formed by two adjacent warps among the plurality of warps and two adjacent wefts among the plurality of wefts. An area defined by a maximum outside diameter of a warp or weft is smaller than an area of an opening space of each of the openings.

19 Claims, 14 Drawing Sheets

CAPACITIVE SENSOR AND METHOD OF MANUFACTURING THE SAME

CROSS REFERENCE TO RELATED APPLICATIONS

The present application is based on and claims priority of Japanese Patent Applications Nos. 2019-135006 filed on Jul. 23, 2019, 2019-135032 filed on Jul. 23, 2019, 2019-206732 filed on Nov. 15, 2019, and 2020-055778 filed on Mar. 26, 2020.

FIELD

Heater-sensors for vehicle seats have conventionally been developed (see Patent Literature [PTL] 1, for example). A heater-sensor includes: a sensor layer that generates a signal for detecting either one of or both the presence of an occupant and contact between the occupant and a vehicle component; and a conductive non-woven fabric tightly fastened to the sensor layer.

CITATION LIST

Patent Literature

PTL 1: Japanese Unexamined Patent Application Publication No. 2018-206776 PTL 2: Japanese Patent No. 5947919

SUMMARY

The heater device according to PTL 1 and a conductive heater according to PTL 2 can be improved upon.

In view of this, the present disclosure provides a steering heater capable of improving upon the above related art.

In accordance with an aspect of the present disclosure, there is provided a capacitive sensor, including: a substrate that is in a form of a sheet and has a frontside and a backside; and a sensor electrode that is capacitive and disposed on the frontside of the substrate, wherein the sensor electrode includes a plurality of warps each of which is a strand and a plurality of wefts each of which is a strand, the sensor electrode is a conductive fabric made by applying a metal plating on a mesh fabric, the mesh fabric being woven of the plurality of warps and the plurality of wefts, the mesh fabric having openings each formed by two adjacent warps among the plurality of warps and two adjacent wefts among the plurality of wefts, and an area defined by one of (i) a maximum outside diameter of a warp among the plurality of warps in cross section along a plane perpendicular to a longitudinal direction of the warp and (ii) a maximum outside diameter of a weft among the plurality of wefts in cross section along a plane perpendicular to a longitudinal direction of the weft is smaller than an area of an opening space of each of the openings.

These general and specific aspects may be implemented to a system, a method, an integrated circuit, a computer program, or a computer-readable recording medium such as a Compact Disc-Read Only Memory (CD-ROM), or may be any combination of them. The recording medium may be non-transitory.

A steering heater and so forth according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENTS

Figure 1:
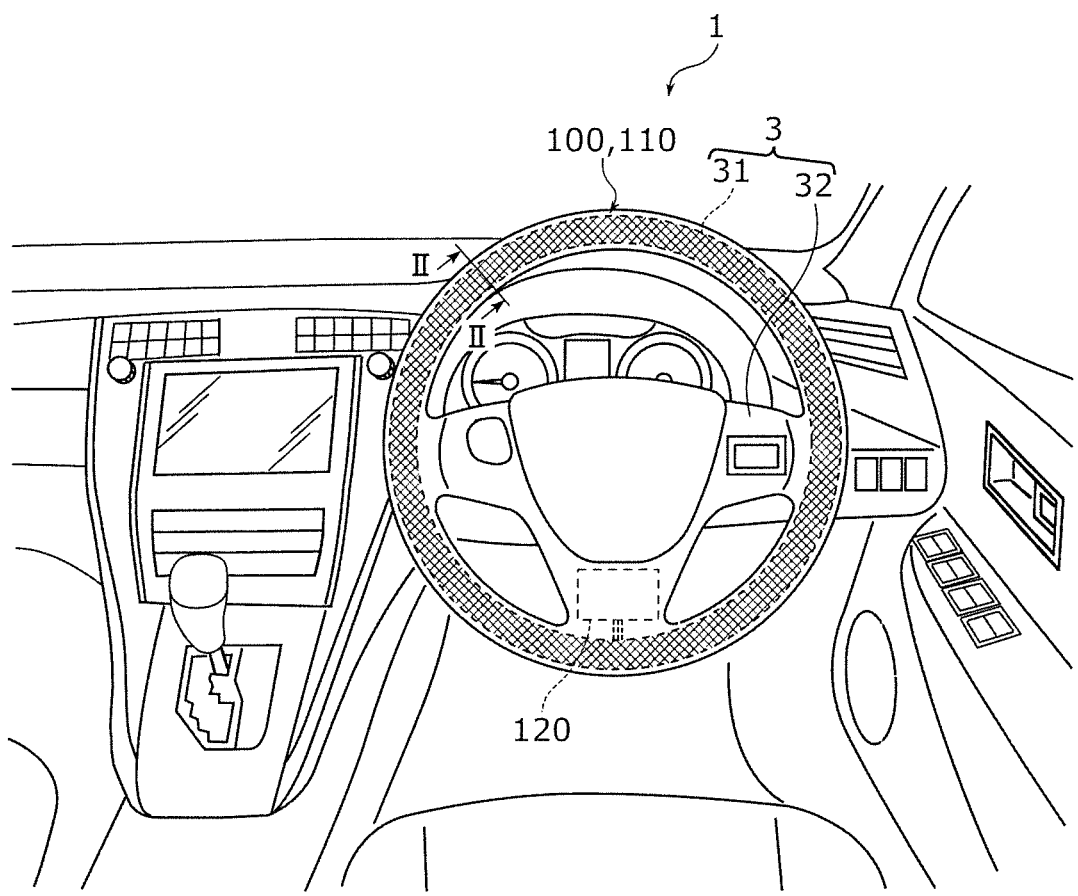
FIG. 1 illustrates an example of an interior of a vehicle equipped with a capacitive sensor according to Embodiment 1.

A conventional capacitive sensor used for a seat heater-sensor or a steering has an issue in reliability of sensing accuracy. For example, to attach a steering cover including such a capacitive sensor to a rim of a vehicle, the steering cover has to be stretched to be wrapped around the rim.

Unfortunately, this stretching stress may cause a crack to a non-woven fabric. Moreover, after the conventional capacitive sensor is wrapped around the rim, the steering cover may be wrinkled when a user holds the steering wheel. Then, distortion of such wrinkles may be followed by distortion of the non-woven fabric. A non-woven fabric is made of interlaced fibers and thus a crack may be caused. Any crack may increase the resistance of the non-woven fiber.

In accordance with an aspect of the present disclosure, there is provided a capacitive sensor including: a substrate that is in a form of a sheet and has a frontside and a backside; and a sensor electrode that is capacitive and disposed on the frontside of the substrate, wherein the sensor electrode includes a plurality of warps each of which is a strand and a plurality of wefts each of which is a strand, the sensor electrode is a conductive fabric made by applying a metal plating on a mesh fabric, the mesh fabric being woven of the plurality of warps and the plurality of wefts, the mesh fabric having openings each formed by two adjacent warps among the plurality of warps and two adjacent wefts among the plurality of wefts, and an area defined by one of (i) a maximum outside diameter of a warp among the plurality of warps in cross section along a plane perpendicular to a longitudinal direction of the warp and (ii) a maximum outside diameter of a weft among the plurality of wefts in cross section along a plane perpendicular to a longitudinal direction of the weft is smaller than an area of an opening space of each of the openings.

As described above, the area defined by the maximum outside diameter of the warp or weft in cross section is smaller than the area of the opening space of the opening. Thus, the mesh sensor electrode has a high proportion of the openings per unit area. If the capacitive sensor is stretched, the sensor electrode also comes under stretching stress and is thus easily stretched. More specifically, the sensor electrode is stretched in response to the stretching stress by changing the shape of the openings. As compared with a non-woven fabric, the sensor electrode is unlikely to have cracks when stretched because the warps and the wefts are strands. Thus, reduction of cracks in the sensor electrode can keep the resistance from increasing.

Hence, the reliability of sensing accuracy of the sensor electrode of the capacitive sensor can be kept from deceasing.

In particular, when the capacitive sensor is stretched, contact pressure increases for both the warp and the weft. This stabilizes the contact pressure at each of contact points between the plurality of warps and the plurality of wefts and thus further enhances the robustness of the sensor electrode.

In accordance with another aspect of the present disclosure, there is provided a method of manufacturing a capacitive sensor including a plurality of warps each of which is a strand and a plurality of wefts each of which is a strand, the method including: applying an electroless plating on a mesh fabric, the mesh fabric being woven of the plurality of warps and the plurality of wefts, the mesh fabric having openings each formed by two adjacent warps among the plurality of warps and two adjacent wefts among the plurality of wefts; producing a sensor electrode by applying an electrolytic plating on the mesh fabric having been applied with the electroless plating in the applying; and disposing the sensor electrode on a frontside of a substrate that is in a form of a sheet, wherein an area defined by one of (i) a maximum outside diameter of a warp among the plurality of warps in cross section along a plane perpendicular to a longitudinal direction of the warp and (ii) a maximum outside diameter of a weft among the plurality of wefts in cross section along a plane perpendicular to a longitudinal direction of the weft, is smaller than an area of an opening space of each of the openings.

This manufacturing method can also achieve advantageous effects similar to those described above.

It is possible that the sensor electrode is bonded to the frontside of the substrate to be fixed to the substrate, and an elongation rate of the sensor electrode obtained when only the sensor electrode is stretched is greater than an elongation rate of the substrate obtained when only the substrate is stretched.

As described above, when the capacitive sensor is stretched and elongated, the sensor electrode can be stretched as much as the substrate can. This further keeps cracks from occurring to the sensor electrode.

It is also possible that a direction in which the sensor electrode is stretched forms an acute angle of roughly 45 degrees with a longitudinal direction of the plurality of warps and with a longitudinal direction of the plurality of wefts.

As described above, the stretching stress is applied to the sensor electrode so that the stretching direction forms the acute angle of about 45 degrees with the longitudinal direction of the plurality of warps and the longitudinal direction of the plurality of wefts. Thus, the elongation rate of the sensor electrode can be maintained, and the capacitive sensor can be easily elongated when stretched. This keeps cracks, which may be caused by the stretching stress, from occurring to the sensor electrode more reliably.

It is further possible that a direction in which the substrate is stretched forms an acute angle of roughly 45 degrees with a longitudinal direction of the plurality of warps and with a longitudinal direction of the plurality of wefts, and the substrate is fixed to equipment in a stretched state.

As described above, the sensor electrode is fixed to the substrate so that the stretching direction forms the acute angle of about 45 degrees with the longitudinal direction of the plurality of warps and the longitudinal direction of the plurality of wefts. More specifically, the sensor electrode is stretched as the substrate is stretched. This keeps cracks from occurring to the sensor electrode of the capacitive sensor more reliably.

It is further possible that the metal plating is achieved by applying an electroless copper plating on the mesh fabric and then further applying an electrolytic nickel plating on the mesh fabric.

After the application of the electroless plating, the electrolytic plating is applied to the mesh fabric having the warps and wefts each of which is a strand. Thus, the plating is achieved while a contact pressure between the warp and the weft is maintained sufficiently. This enhances the contact pressure at each of contact points between the plurality of warps and the plurality of wefts and thus further improves the robustness of the sensor electrode.

Moreover, unlike a case where only an electroless plating is applied to the mesh fabric, the sensor electrode according to the present disclosure has high crystalline nature and high corrosion resistance. This can reduce an increase in resistance of the sensor electrode caused by corrosion in an actual usage environment.

Furthermore, the mesh fabric having applied with the electroless plating has a high proportion of the openings per unit area. Thus, as compared with a conventional non-woven fabric, an area to be plated is smaller and a current required for electrolytic plating is also relatively smaller. This prevents an increase in power consumption required for electrolytic plating. Hence, the manufacturing cost of the capacitive sensor including the sensor electrode can be kept from escalating.

Moreover, the metal plating is achieved by applying the electrolytic plating on the mesh fabric having been applied with the electroless plating. Thus, the metal plating having high crystalline nature can be formed on the surface of the mesh fabric without, for example, annealing treatment. This is suitable especially when the mesh fabric is a resin, for example.

Furthermore, the mesh fabric covered with the electrolytic nickel plating after applied with the electroless copper plating can be prevented from oxidation of copper plating. In addition, continuity of the contact point between the warp and the weft can be improved.

It is further possible that a maximum width of each of the openings is smaller than a width of a human finger.

In this way, the sensor electrode is capable of reliably detecting the presence of the human finger. This enables the capacitive sensor to maintain the sensing accuracy.

It is further possible that, as seen from a top view of the sensor electrode, a first area of a contact point where the warp and the weft overlap each other is smaller than a second area that is the area of the opening space of each of the openings.

Thus, unlike a case where the first area is larger than the second area, the sensor electrode can maintain the elongation rate when stretched because of a smaller area of contact between the warp and the weft. This keeps cracks from occurring to the sensor electrode of the capacitive sensor more reliably.

It is further possible that the capacitive sensor further includes a control circuit that is electrically connected to the sensor electrode, wherein the sensor electrode is disposed on a steering wheel and detects contact between a human body and the steering wheel, and the control circuit is electrically connected to the sensor electrode via which the control circuit detects the contact between the human body and the steering wheel.

In this way, the electrical connection between the sensor electrode and the control circuit enables detection of contact or grip performed on the steering wheel.

It is further possible that the openings have roughly identical shapes and are arranged regularly in the longitudinal direction of the warp and the longitudinal direction of the weft.

Thus, when the capacitive sensor in the stretched state is wrapped around the steering wheel, the openings come under the stretching stress and partially under compression stress and thus change in shape in a roughly regular manner. Then, the contact points between the warps and the wefts also come under roughly the same stress. This keeps cracks from occurring to the sensor electrode more reliably.

It is further possible that the capacitive sensor further includes: a surface layer that comes in contact with a human hand; and a moisture-proof layer disposed on a backside of the surface layer, wherein the sensor electrode is disposed opposite to the surface layer across the moisture-proof layer, the substrate is disposed opposite to the moisture-proof layer across the sensor electrode, the moisture-proof layer and the sensor electrode are bonded together with a first adhesive layer, the sensor electrode and the substrate are bonded together with a second adhesive layer, and the moisture-proof layer is lower in moisture permeability than the first adhesive layer and the second adhesive layer.

For example, by the contact between the hand of the user and the surface layer, moisture from, for instance, perspiration of the hand (such as moisture vapor) may be mixed with residues contained in the material of the surface layer to turn into acidic corrosive water. Such corrosive water may penetrate into the capacitive sensor to reach the sensor electrode. In this case, the sensor electrode may be corroded by this corrosive water.

However, the moisture-proof layer is disposed on the backside of the surface layer and interposed between the surface layer and the sensor electrode, according to the present disclosure. To be more specific, the moisture-proof layer is closer to the outside than the sensor electrode is. Moreover, the moisture-proof layer is lower in moisture permeability than the first adhesive layer and the second adhesive layer. Thus, even if the surface layer is in a condition of high temperature and humidity because the hand of the user comes in contact with the surface layer, the moisture-proof layer can keep moisture given by the hand of the user from reaching the sensor electrode.

In this way, the sensor electrode of the capacitive sensor can be protected from corroding.

It is further possible that each of the first adhesive layer and the second adhesive layer is a substrate-less double-stick tape.

This capacitive sensor is stretched more easily than a capacitive sensor including a double-stick tape having a substrate. More specifically, when the capacitive sensor including the substrate-less double-stick tape is stretched, the openings of the sensor electrode are not prevented unduly from changing in shape. This can maintain a constant elongation rate of the capacitive sensor.

Moreover, the moisture-proof layer and the sensor electrode can be boned together without loss of extensibility. In addition, the sensor electrode and the substrate can be boned together without loss of extensibility. This results in an improvement in workability for attaching the capacitive sensor.

It is further possible that the moisture-proof layer has a thickness smaller than a thickness of the first adhesive layer and than a thickness of the second adhesive layer.

The thickness of the moisture-proof layer is small and thus the thickness of the capacitive sensor according to the present disclosure is not so different from that of a capacitive sensor including no moisture-proof layer. For this reason, when the capacitive sensor is to be wrapped around the rim of the steering wheel of the vehicle, the increase in the thickness of the capacitive sensor hardly causes any problems in the wrapping operation. Moreover, unevenness in level is small around the perimeter of the moisture-proof layer, which reduces discomfort of the driver holding the steering wheel.

It is further possible that, as seen from a top view in which the sensor electrode, the moisture-proof layer, and the substrate are laminated, an area of the sensor electrode is smaller than an area of the moisture-proof layer and than an area of the substrate, and the sensor electrode is covered with the first adhesive layer and the second adhesive layer.

Thus, even if the surface layer is in a condition of high temperature and humidity, corrosive water hardly reaches the sensor electrode that is covered and interposed between the first adhesive layer and the second adhesive layer. As a result, the sensor electrode of the capacitive sensor can be protected from corroding more reliably.

It is further possible that the surface layer and the moisture-proof layer are bonded together with a third adhesive layer, and an outer region of the third adhesive layer is bonded to the first adhesive layer and the second adhesive layer.

Thus, the sensor electrode is sealed with the third adhesive layer, the first adhesive layer, and the second adhesive layer, and thus corrosive water hardly reaches the sensor electrode. As a result, the sensor electrode of the capacitive sensor can be protected from corroding more reliably.

The capacitive sensor in another aspect according to the present disclosure includes a grounding electrode that is disposed opposite to the sensor electrode across the substrate.

For example, in the capacitive sensor to be wrapped around the rim of the steering, a distance between the grounding electrode and the sensor electrode is smaller than a distance between a conductive core bar of the rim and the sensor electrode according to the present disclosure. Thus, a first capacitance between the grounding electrode and the sensor electrode is greater than a second capacitance between the core bar and the sensor electrode. To be more specific, contact between the surface layer and the hand of the user is detected based on a sum of capacitance from the hand to the sensor electrode and capacitance from the sensor electrode to the grounding electrode. This increases the sensitivity and thus further keeps the sensing accuracy of the capacitive sensor from deceasing.

It is further possible that the third adhesive layer is a substrate-less double-stick tape.

Thus, the surface layer and the moisture-proof layer can be boned together without loss of extensibility. This results in an improvement in workability for attaching the capacitive sensor.

It is further possible that the sensor electrode includes a plurality of conductive fabrics disposed in at least three locations along a circumferential direction of a steering wheel, each of the plurality of conductive fabrics includes an electrode and a signal extractor extending from the electrode to a predetermined position, the plurality of conductive fabrics includes a first conductive fabric located closer to the predetermined position and a second conductive fabric located farther from the predetermined position than the first conductive fabric is, the first conductive fabric is divided into two that are arranged in a direction perpendicular to the circumferential direction of the steering wheel, and the signal extractor of the second conductive fabric extends from the electrode of the second conductive fabric to the predetermined position along between the two included in the first conductive fabric, without being electrically connected to the first conductive fabric.

For example, to detect which part of the steering comes in contact with the hand of the user, sensor electrodes may be disposed at a plurality of positions. In this case, signals of the sensor electrodes are extracted from signal extractors located at a predetermined position. Here, the signal extractor of the sensor electrode, among the sensor electrodes, located away from the predetermined position may be drawn to the predetermined position along the end edge of the substrate. The plurality of sensor electrodes including the signal extractors arranged as described above and the surroundings including the substrate are sewn onto the surface layer with a sewing thread, usually along the end edge of the substrate. Thus, sewing stress is applied to the signal extractors arranged along the end edge of the substrate. The signal extractor is a lead smaller in width than the sensor electrode, and thus may be unfortunately damaged by this stress.

Moreover, continued contact with the hand of the user puts the steering under a condition of high temperature and humidity. By the contact between the hand of the user and the surface layer of the steering, moisture from, for instance, perspiration of the hand (such as moisture vapor) may penetrate from the sewed part to reach the signal extractors arranged along the end edge of the substrate. In this case, because the signal extractor having a width extremely smaller than the width of the sensor electrode is low in corrosion resistance, any corrosion may easily cause a problem to the capacitive sensor.

However, the first conductive fabric is divided into two that are arranged side by side in the direction perpendicular to the circumferential direction of the steering wheel, according to the present disclosure. A signal extraction lead of the second conductive fabric located farther from the predetermined position than the first conductive fabric is disposed along between the two included in the first conductive fabric. To be more specific, the signal extraction lead of the second conductive fabric is interposed between the two included in the first conductive fabric in a central portion of the substrate. Thus, the sewing stress is hardly applied to the signal extraction lead of the second conductive fabric.

Moreover, the signal extraction lead of the second conductive fabric is located away from the sewed part (the sewing thread). Thus, even if moisture from, for instance, perspiration of the hand of the user penetrates from the sewed part, corrosion hardly occurs to the signal extraction lead.

Thus, the signal extraction lead of the capacitive sensor can be protected from damage and corrosion.

It is further possible that, as seen from a top view in which the plurality of conductive fabrics, the surface layer, and the substrate are laminated, a total area of the plurality of conductive fabrics is smaller than an area of the surface layer and than an area of the substrate, and the plurality of conductive fabrics are covered with the first adhesive layer and the second adhesive layer.

Thus, even if the surface layer is in a condition of high temperature and humidity, moisture further hardly reaches the sensor electrode, which is a conductive fabric covered between the first adhesive layer and the second adhesive layer. As a result, the sensor electrode of the capacitive sensor can be protected from corroding more reliably.

It is further possible that the capacitive sensor further includes a grounding electrode that is disposed opposite to the sensor electrode across the substrate.

For example, in the capacitive sensor to be wrapped around the rim of the steering, a distance between the grounding electrode and the sensor electrode is smaller than a distance between a conductive core bar of the rim and the sensor electrode according to the present disclosure. Thus, a first capacitance between the grounding electrode and the sensor electrode is greater than a second capacitance between the core bar and the sensor electrode. To be more specific, contact between the surface layer and the hand of the user is detected based on a sum of capacitance from the hand to the sensor electrode and capacitance from the sensor electrode to the grounding electrode. This increases the sensitivity and thus further keeps the sensing accuracy of the capacitive sensor from deceasing.

The following specifically describes embodiments with reference to the drawings.

The following embodiments are general or specific examples of the present disclosure. The numerical values, shapes, materials, elements, arrangement and connection configuration of the elements, steps, the order of the steps, etc., described in the following embodiments are merely examples, and are not intended to limit the present disclosure. Among elements in the following embodiments, those not described in any one of the independent claims indicating the broadest concept of the present disclosure are described as optional elements.

Note that the respective figures are schematic diagrams and are not necessarily precise illustrations. Additionally, components that are essentially the same share like reference signs in the figures. It should also be noted that the following embodiments may include expressions "roughly T-shaped", etc. However, such expressions sometimes do not literally mean the roughly T-shaped. For example, sometimes does not mean completely T-shaped but means substantially T-shaped. In other words, "roughly T-shaped" includes a difference of about several % from completely T-shaped. Furthermore, "roughly T-shaped" means T-shaped in the scope of producing the advantageous effects of the present disclosure. The same is applied to other expressions including "roughly".

Embodiment 1

[Configuration: Capacitive Sensor 100]

FIG. 1 illustrates an example of an interior of vehicle 1 equipped with capacitive sensor 100 according to Embodiment 1.

As illustrated in FIG. 1, vehicle 1 includes steering wheel 3, a speaker, and a display device, such as a liquid crystal display. The speaker and the display device are configured as warning devices, for example.

Steering wheel 3 provides a steering wheel of vehicle 1 with a steering angle. Steering wheel 3 has: rim 31; spoke 32 that is roughly T-shaped and integral with an inner periphery of rim 31; and a horn switch cover (not shown) that covers a horn switch (not shown) located in a central portion of spoke 32.

Figure 2:
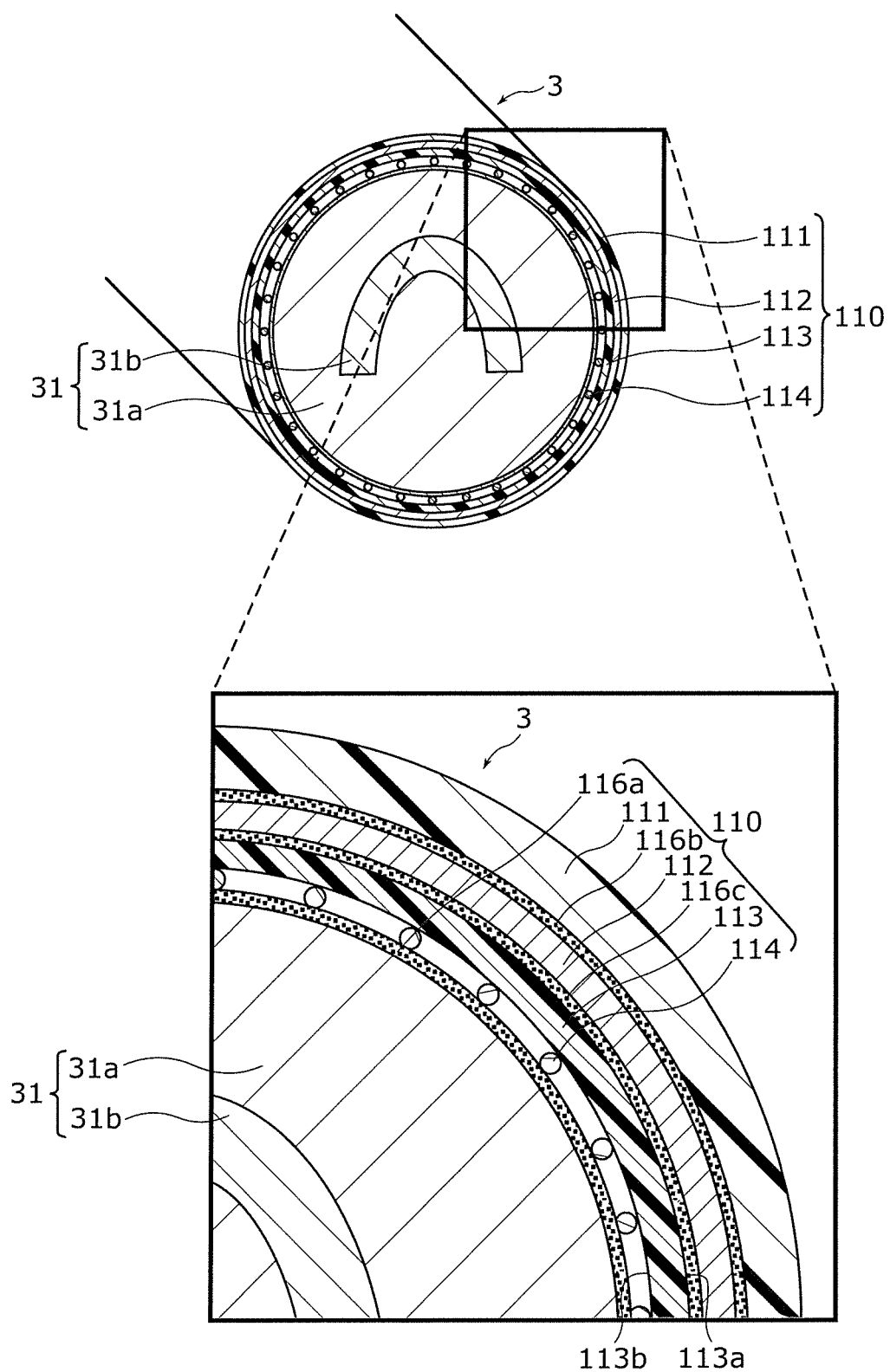
FIG. 2 illustrates a cross-sectional view of a steering cover and a rim wrapped with the steering cover taken along line II-II of FIG. 1, and also illustrates a partially enlarged cross-sectional view of the rim and the steering cover.
Figure 3:
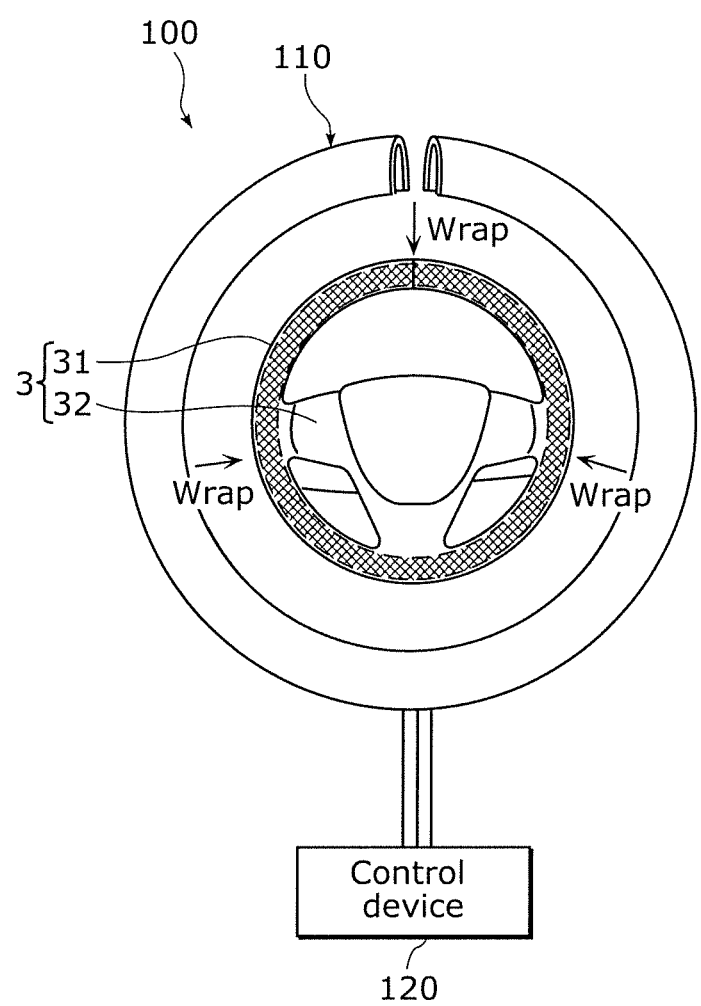
FIG. 3 illustrates an example of how the steering cover including the capacitive sensor is wrapped around the rim, according to Embodiment 1.

FIG. 2 illustrates a cross-sectional view of steering cover 110 and rim 31 wrapped with steering cover 110 taken along line II-II of FIG. 1, and also illustrates a partially enlarged cross-sectional view of rim 31 and steering cover 110. FIG. 3 illustrates an example of how steering cover 110 including capacitive sensor 100 is wrapped around rim 31, according to Embodiment 1.

As illustrated in FIG. 2 and FIG. 3, capacitive sensor 100 is a device that detects contact between a hand of a user (a human body) and steering cover 110 and provided for rim 31 of vehicle 1. Here, the state of "contact" refers to not only a state in which the hand of the user comes in direct contact with steering cover 110 but also, if capacitive sensor 100 is capable of detecting a human hand, a state in which the hand of the user is apart from steering cover 110.

For example, capacitive sensor 100 is a capacitive proximity sensor and also a grip sensor that detects grip of the user present in vehicle 1 including steering wheel 3. To be more specific, capacitive sensor 100 detects whether the hand of the user is in contact with steering wheel 3 by detecting a change in capacitance between the hand of the user and sensor electrode 112 of capacitive sensor 100. When the hand of the user is apart from steering wheel 3, capacitive sensor 100 detects capacitance between vehicle 1 and sensor electrode 112. When the hand of the user approaches or comes in contact with steering cover 110, capacitance changes because the hand of the user is between capacitive sensor 100 and vehicle 1. If the detected capacitance is more than or equal to a specified value, it may be determined that the hand of the user is in contact with or gripping steering wheel 3.

Figure 4:
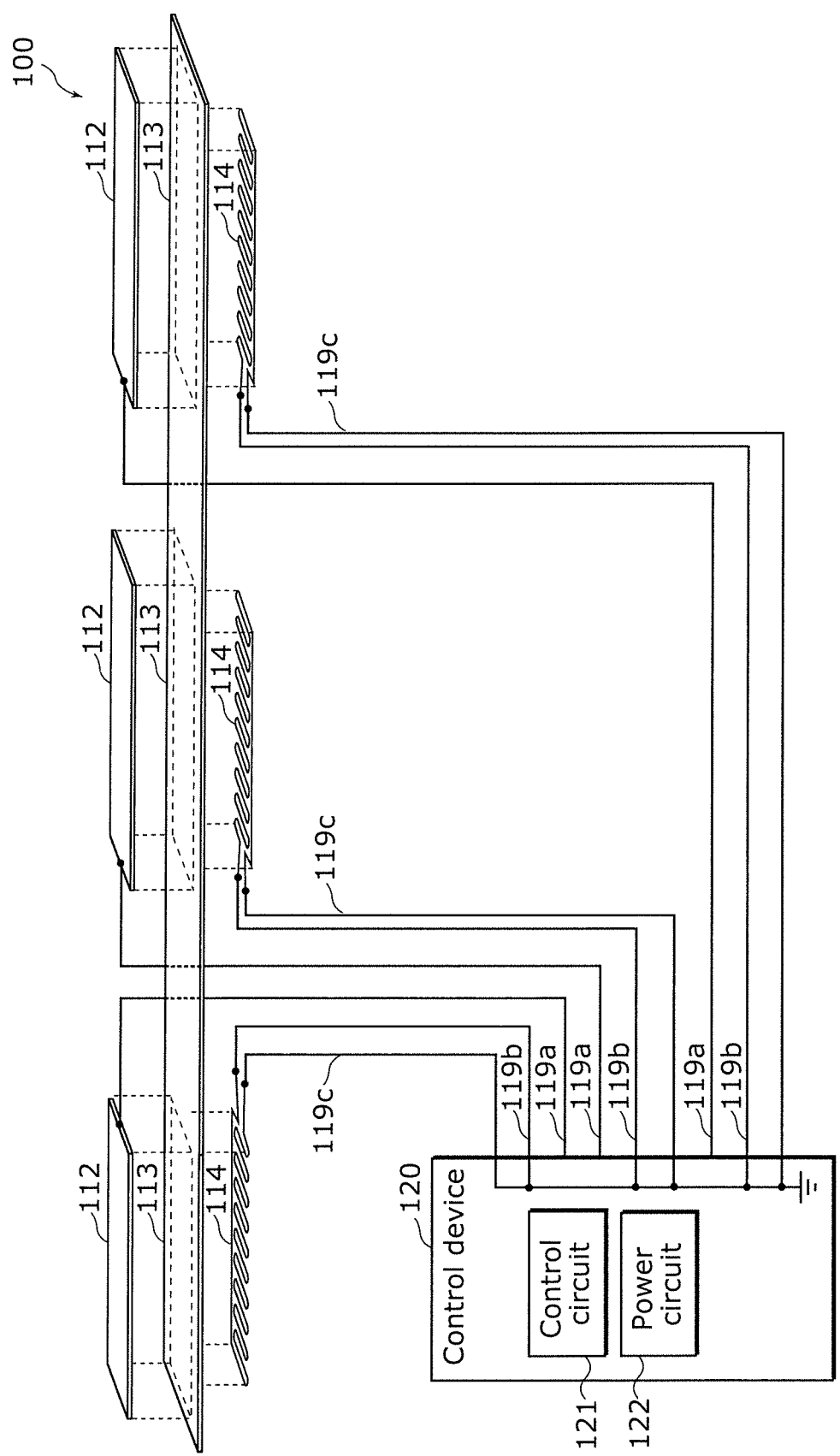
FIG. 4 is a block diagram of a configuration of the capacitive sensor according to Embodiment 1.

FIG. 4 is a block diagram of a configuration of capacitive sensor 100 according to Embodiment 1.

As illustrated in FIG. 2 and FIG. 4, capacitive sensor 100 includes surface layer 111, sensor electrode 112, substrate 113, grounding electrode 114, and control device 120.

[Surface Layer 111]

Surface layer 111 is a part to be touched by the hand and is an outer surface of capacitive sensor 100. More specifically, surface layer 111 is a part that comes in direct contact with the hand of the user when the user grips rim 31. Surface layer 111 is made of, for example, leather, wood, or resin. In the present embodiment, surface layer 111 is made of leather.

[Sensor Electrode 112]

Sensor electrode 112 is disposed in steering wheel 3. To be more specific, sensor electrode 112 is disposed on a backside of surface layer 111 and on frontside 113a of substrate 113. In other words, sensor electrode 112 is interposed between surface layer 111 and substrate 113. To be fixed to substrate 113, sensor electrode 112 is bonded to the backside of surface layer 111 with first adhesive layer 116b and to frontside 113a of substrate 113 with second adhesive layer 116c. Frontside 113a of substrate 113 is opposite to surface layer 111.

It should be noted that only one or more than one sensor electrode 112 may be disposed on frontside 113a of substrate 113. As illustrated in FIG. 4, capacitive sensor 100 includes three sensor electrodes 112 and three grounding electrodes 114 in the present embodiment. The description is presented with reference to this diagram. For the sake of simplicity, the following describes mainly one of three sensor electrodes 112 and one of three grounding electrodes 114.

First sensor electrode 112 among three sensor electrodes 112 is disposed at one end part of capacitive sensor 100 wrapped around rim 31 (for example, disposed on the right side as rim 31 is viewed from the front). Second sensor electrode 112, which is another electrode among three sensor electrodes 112, is disposed at the other end part of capacitive sensor 100 wrapped around rim 31 (for example, disposed on the left side as rim 31 is viewed from the front). Third sensor electrode 112, which is the last one among three sensor electrodes 112, is interposed between first sensor electrode 112 and second sensor electrode 112.

Figure 5:
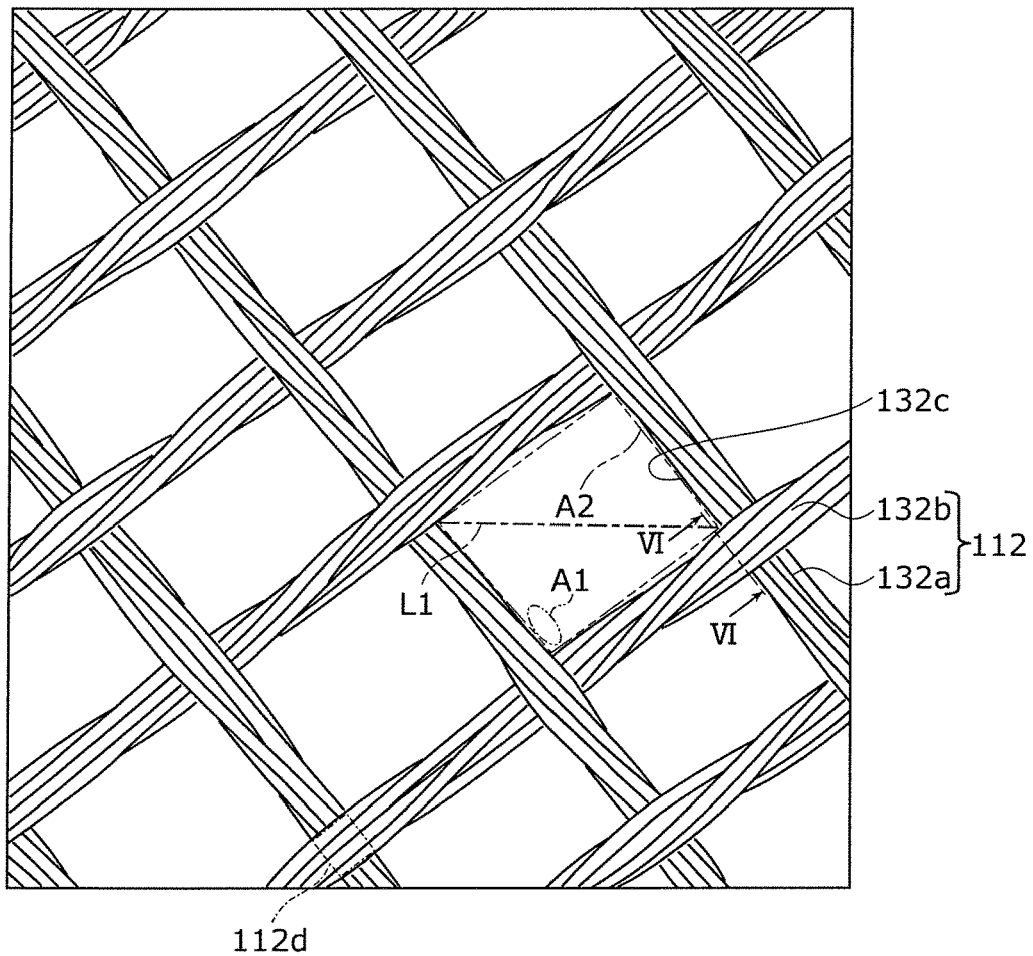
FIG. 5 is a partially enlarged cross-sectional view of warps and wefts of a sensor electrode.

FIG. 5 is a partially enlarged cross-sectional view of warp 132a and weft 132b of sensor electrode 112.

As illustrated in FIG. 5, sensor electrode 112 is a capacitive sensor electrode that is a conductive fabric made by plating non-metallic fibers. To be more specific, sensor electrode 112 is produced by applying a first metal plating on a surface of a mesh fabric woven of non-metallic fibers, such as polyethylene terephthalate (PET), and then further applying a second metal plating on a surface of the first metal plating. Alternatively, sensor electrode 112 is produced by applying a first metal plating on a surface of non-metallic fibers, such as polyethylene terephthalate (PET), and then weaving conductive fibers having applied with a second metal plating onto a surface of the first metal plating. For example, the first metal plating is copper and the second metal plating is nickel.

More specifically, sensor electrode 112 includes a plurality of warps 132a and a plurality of wefts 132b, each of which is a strand formed by stranding a plurality of lines (the aforementioned non-metallic fibers). Sensor electrode 112 is a conductive fabric made by applying a metal plating on a mesh fabric that is woven of the plurality of warps 132a and the plurality of wefts 132b and that has openings 132c each formed by two adjacent warps among the plurality of warps 132a and two adjacent wefts among the plurality of wefts 132b.

Here, opening 132c of sensor electrode 112 is rectangular in plan view. Openings 132c having roughly the same shape are arranged regularly in a longitudinal direction of warp 132a and a longitudinal direction of weft 132b. In the present embodiment, openings 132c are arranged in a grid pattern. Maximum width L1 of opening 132c is smaller than a width of a human finger. Here, the width of the human finger may be a width of one finger or a width of at least two fingers but no more than five fingers. To be more specific, maximum width L1 of opening 132c is determined in accordance with the width of the human finger defined based on a threshold of the capacitance used for determining the grip.

The plurality of warps 132a of sensor electrode 112 are arranged at an angle of about 45 degrees with respect to a longitudinal or lateral direction of sensor electrode 112 in plan view before steering cover 110 is wrapped around rim 31. The plurality of wefts 132b of sensor electrode 112 are arranged roughly linearly and roughly perpendicular to the plurality of warps 132a in plan view before steering cover 110 is wrapped around rim 31. More specifically, the mesh fabric has a plurality of openings 132c that are formed by the plurality of warps 132a and the plurality of wefts 132b woven together.

Figure 6:
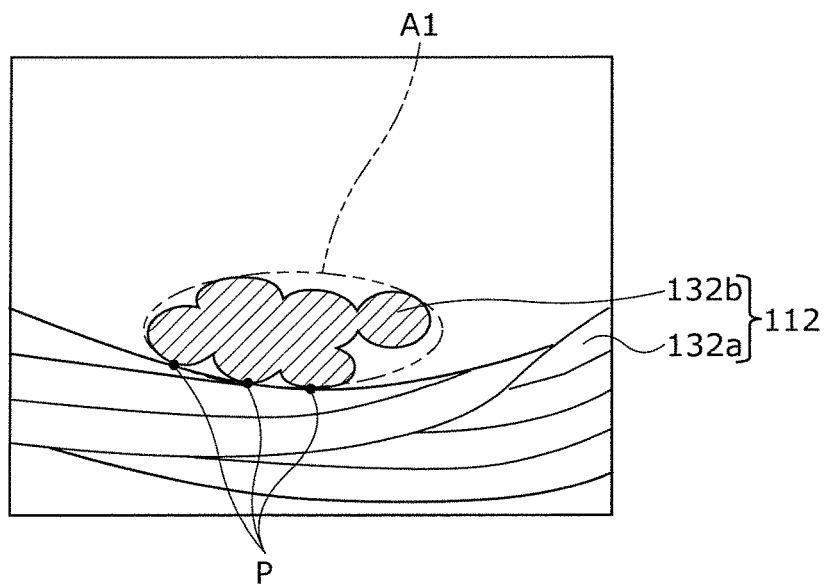
FIG. 6 is a partially enlarged cross-sectional view of the sensor electrode, illustrating the warp taken along line VI-VI of FIG. 5 and a side surface of the weft.

FIG. 6 is a partially enlarged cross-sectional view of sensor electrode 112, illustrating warp 132a taken along line VI-VI of FIG. 5 and a side surface of weft 132b.

As illustrated in FIG. 5 and FIG. 6, the mesh fabric woven of the plurality of warps 132a and the plurality of wefts 132b is coated with the metal plating and thus, obviously, the plurality of warps 132a and the plurality of wefts 132b are electrically connected at each of contact points P between the plurality of warps 132a and the plurality of wefts 132b. Here, the metal plating is achieved by applying an electroless copper plating on the mesh fabric and then further applying an electrolytic nickel plating on this mesh fabric. At each of contact points P, warp 132a and weft 132b overlap each other and come in contact with each other (to be electrically continuous).

Unlike a case where an electroless nickel plating is applied to a mesh fabric having been applied with an electroless copper plating, the electrolytic nickel plating is further applied to the mesh fabric having been applied with the electroless copper plating in the present embodiment. Thus, sensor electrode 112 according to the present embodiment has high crystalline nature and high corrosion resistance. This can reduce an increase in resistance of sensor electrode 112 caused by corrosion in an actual usage environment. Moreover, each of the plurality of warps 132a is a strand and each of the plurality of wefts 132b is a strand, which allows the plating to be achieved while contact pressure between warp 132a and weft 132b is maintained sufficiently. The contact pressure at contact points P between the plurality of warps 132a and the plurality of wefts 132b of sensor electrode 112 is enhanced, so that warp 132a and weft 132b are connected tightly at contact point P. When capacitive sensor 100 is stretched, the contact pressure increases for both warp 132a and weft 132b. This stabilizes the contact pressure at each of contact points P between the plurality of warps 132a and the plurality of wefts 132b and thus achieves tighter connection between warp 132a and weft 132b.

As illustrated in FIG. 5, an area defined by a maximum outside diameter, indicated by a long dashed double-short dashed line, of one warp 132a among the plurality of warps 132a in cross section along a plane perpendicular to the longitudinal direction of warp 132a is smaller than an area of an opening space of opening 132c. Moreover, area A1 defined by a maximum outside diameter of one weft 132b among the plurality of wefts 132b in cross section along a plane perpendicular to the longitudinal direction of weft 132b is smaller than area A2 of the opening space of opening 132c. Here, the maximum outside diameter refers to a maximum diameter defined by, for example, a circle formed by warp 132a or weft 132b. Note that, in FIG. 5, area A1 indicated by a long dashed double-short dashed line is illustrated simply for comparison with A2 indicated by a long dashed double-short dashed line.

An elongation rate of sensor electrode 112 obtained when only sensor electrode 112 is stretched is greater than an elongation rate of substrate 113 obtained when only substrate 113 is stretched. The larger the area of the opening space of opening 132c is than the area defined by the maximum outside diameter of warp 132a or weft 132b, the greater the elongation rate of sensor electrode 112 is.

Figure 7:
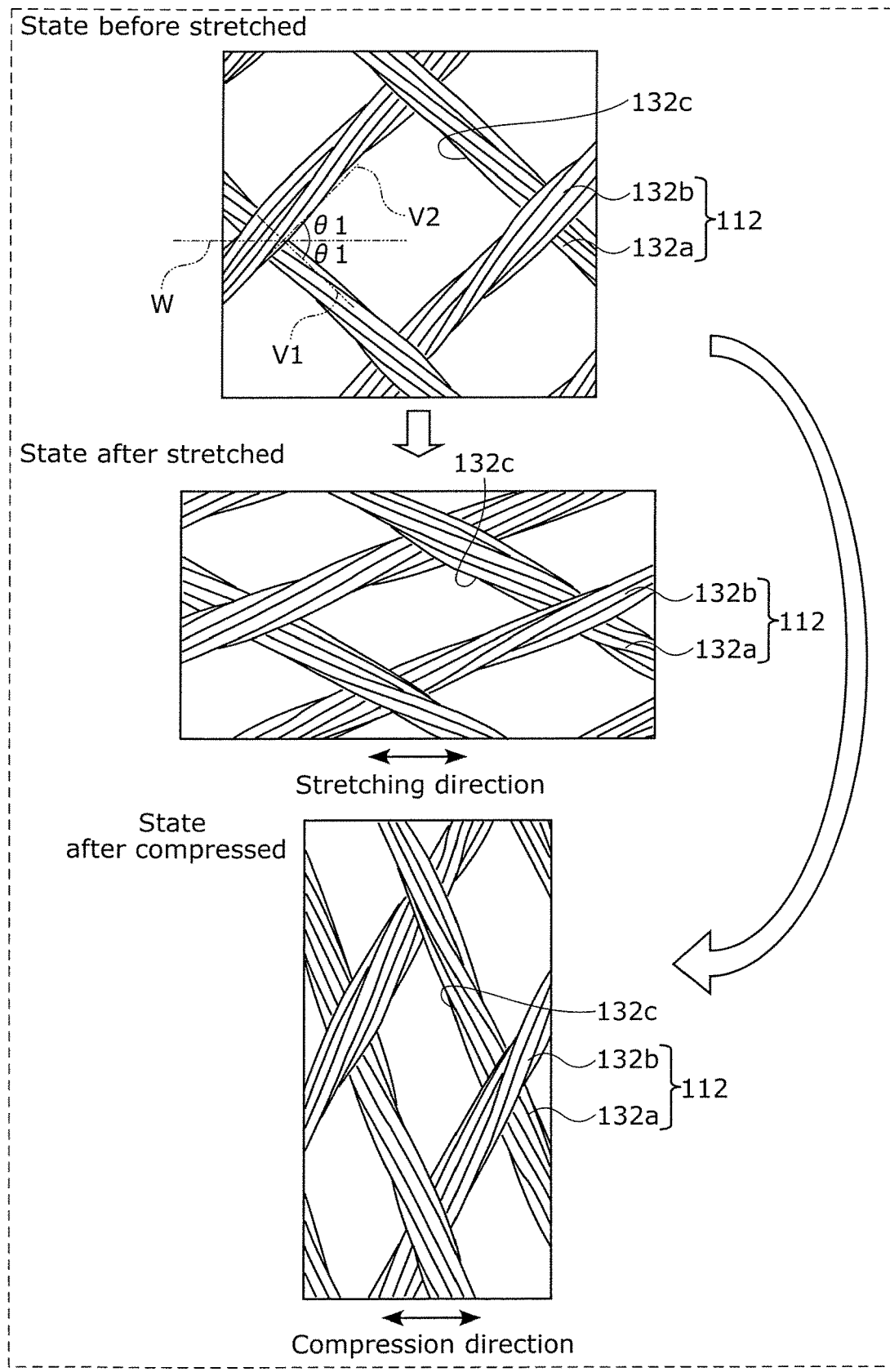
FIG. 7 is a partially enlarged top view illustrating states of the sensor electrode before stretched, after stretched, and after compressed.

FIG. 7 is a partially enlarged top view illustrating a state of sensor electrode 112 before stretched, a state of sensor electrode 112 after stretched (a state of sensor electrode 112 after rim 31 is wrapped with steering wheel 3, for example), and a state of sensor electrode 112 after compressed.

As illustrated in FIG. 7, if sensor electrode 112, which is the mesh conductive fabric, is stretched in a direction crossing the longitudinal directions of the plurality of warps 132a and the plurality of wefts 132b, the plurality of warps 132a and the plurality of wefts 132b move to reduce angle θ1 between the stretching direction and each of the longitudinal directions of the plurality of warps 132a and the plurality of wefts 132b. When only sensor electrode 112 is stretched, sensor electrode 112 extends to change the shapes of the plurality of openings 132c from rectangles to rhombuses. More specifically, stretching stress on warp 132a and weft 132b can be reduced. Similarly, when (after) sensor electrode 112 is compressed, openings 132c of sensor electrode 112 change in shape. To be more specific, compression stress on warp 132a and weft 132b can be reduced. Because warp 132a and weft 132b are tightly connected at contact point P in FIG. 6, a conduction status illustrated in FIG. 16B described later is not inhibited even when sensor electrode 112 is stretched or compressed.

To be more specific, straight line W roughly parallel to the direction in which sensor electrode 112 is stretched forms an acute angle of about 45 degrees as angle θ1 with straight line V1 roughly parallel to the longitudinal direction of the plurality of warps 132a and straight line V2 roughly parallel to the longitudinal direction of the plurality of wefts 132b. Thus, stretched in a direction in which sensor electrode 112 is most easily stretched, sensor electrode 112 is fixed to frontside 113a of substrate 113 while straight line W roughly parallel to the stretching direction in which substrate 113 is stretched forms the acute angle of about 45 degrees as angle θ1 with straight line V1 roughly parallel to the longitudinal direction of warp 132a and with straight line V2 roughly parallel to the longitudinal direction of weft 132b. If capacitive sensor 100 is stretched in the longitudinal or lateral direction to be wrapped around rim 31, sensor electrode 112 is stretched as substrate 113 is stretched because sensor electrode 112 has a higher elongation rate than substrate 113.

After rim 31 is wrapped with steering wheel 3, the stretched state of sensor electrode 112 is still maintained. Thus, angle θ1 is obviously about 45 degrees or less.

As illustrated in plan view of sensor electrode 112 in FIG. 5, first area 112d at contact point P where warp 132a and weft 132b overlap each other is smaller than second area A2 that is the area of the opening space of opening 132c. Unlike a sensor electrode having first area 112d larger than second area A2, sensor electrode 112 according to the present embodiment has first area 112d smaller than second area A2 and thus an area of contact between warp 132a and weft 132b is small. This allows the openings to change more in shape and thus enables sensor electrode 112 to be more easily stretched under the stretching stress.

Figure 10:
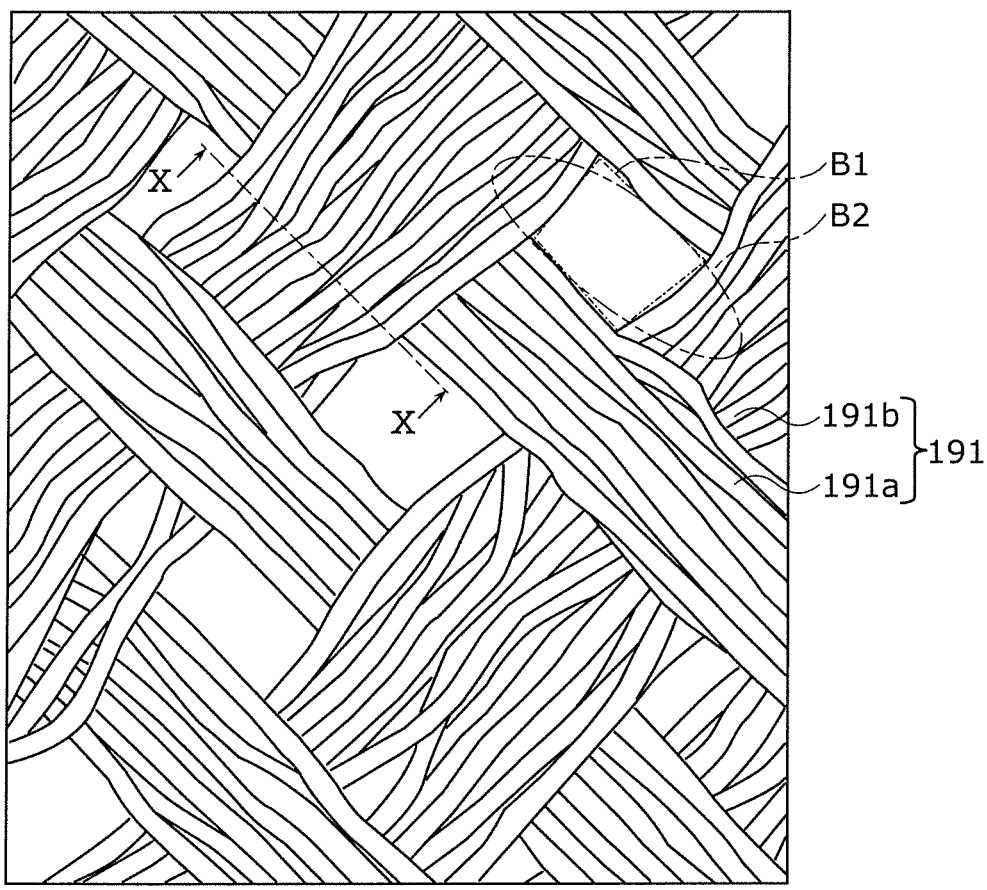
FIG. 10 is a partially enlarged cross-sectional view of warps and wefts of a plain-woven fabric, which is a typical fabric, according to a comparative example.

Here, openings 132c allow sensor electrode 112 to be stretched. Thus, as compared with a metal-plated non-woven or plain-woven fabric (having a structure as illustrated in FIG. 10 described later), the stress on the plurality of warps 132a and the plurality of wefts 132b when stretched is extremely small. This can reduce an adverse effect, such as a crack, on the metal plating caused due to the stress on warp 132a and weft 132b. Hence, high reliability can be ensured.

[Substrate 113]

Substrate 113 is a non-woven fabric in the form of a long sheet made of a material having elasticity, flexibility, and ductility. For example, substrate 113 is made of a synthetic resin, such as polyethylene (PE) or polyethylene terephthalate (PET). Substrate 113 is produced according to the shape and size of rim 31.

Substrate 113 has frontside 113a and backside 113b. On frontside 113a, sensor electrode 112 is disposed via second adhesive layer 116c. On backside 113b, grounding electrode 114 is disposed. Substrate 113 is disposed opposite to surface layer 111 across sensor electrode 112, and on a surface of grounding electrode 114 opposite to sensor electrode 112. More specifically, substrate 113 is interposed between sensor electrode 112 and grounding electrode 114.

Moreover, substrate 113 in a stretched state is fixed to rim 31 via grounding electrode 114 when rim 31 is wrapped with steering cover 110. Here, rim 31 is an example of equipment. The equipment is an object to which capacitive sensor 100 is to be mounted, and thus is not limited to rim 31.

[Grounding Electrode 114]

Grounding electrode 114 is a metallic wire (a conductive wire), such as a copper wire. Each of grounding electrodes 114 is electrically connected to control circuit 121 via, for example, lines 119b and 119c, and is grounded.

Grounding electrode 114 may be a solid electrode having a planar structure made of a conductor or resistor. More specifically, grounding electrode 114 may be in the form of a line or plate. Grounding electrode 114 is made of a conductive wire. However, any member having conductivity may be used.

Grounding electrode 114 is disposed opposite to sensor electrode 112 across substrate 113. More specifically, grounding electrode 114 is disposed on backside 113b of substrate 113 and on a surface of rim 31, and bonded to the surface of rim 31 with adhesive 116a. To be more specific, grounding electrode 114 is interposed between rim 31 and substrate 113. For example, grounding electrode 114 is sewn onto substrate 113 with a sewing thread. Backside 113b of substrate 113 is opposed to rim 31 of steering wheel 3.

In the present embodiment, each of first adhesive layer 116b and second adhesive layer 116c is a substrate-less double-stick tape. More specifically, each of first adhesive layer 116b and second adhesive layer 116c is made of only an adhesive. Each of first adhesive layer 116b and second adhesive layer 116c has a thickness of about 100 µm, for example. However, the thickness is not limited to this. Note that adhesive 116a, first adhesive layer 116b, and second adhesive layer 116c may or may not be included as components of capacitive sensor 100. Each of adhesive 116a, first adhesive layer 116b, and second adhesive layer 116c is an adhesive or a double-stick tape, for example.

In the present embodiment, one of grounding electrodes 114 corresponds to one of sensor electrodes 112 and is disposed at one end part of capacitive sensor 100 wrapped around rim 31 (for example, on the right side). The other of grounding electrodes 114 corresponds to the other of sensor electrodes 112 and is disposed at the other end part of capacitive sensor 100 wrapped around rim 31 (for example, on the left side).

[Control Device 120]

Control device 120 is buried in spoke 32, for example. Control device 120 is electrically connected to grounding electrode 114 and sensor electrode 112, and detects contact between the hand of the user and steering wheel 3 on the basis of a signal transmitted from sensor electrode 112. More specifically, control device 120 measures contact between the hand of the user and surface layer 111. In other words, control device 120 detects whether the hand of the user is in contact with rim 31, or more specifically, detects contact of the hand or a location of the contact of the hand, for example.

Control device 120 includes control circuit 121 and power circuit 122.

Control circuit 121 includes a sensor circuit that detects contact between the human body and steering wheel 3 detected by sensor electrode 112. Control circuit 121 is electrically connected to each of sensor electrodes 112 via which control circuit 121 detects contact between the human body and steering wheel 3.

To be more specific, control circuit 121 passes an alternating current through three sensor electrodes 112 via lines 119a, 119b, and 119c, that is, applies a measurement potential to sensor electrodes 112. Control circuit 121 is electrically connected to three sensor electrodes 112 via lines 119a, 119b, and 119c. If the hand of the user comes in contact with surface layer 111 of rim 31, capacitance of sensor electrode 112 corresponding to a contact area changes. Control circuit 121 measures the change in capacitance of sensor electrode 112 on the basis of a value of current (measurement potential) passing through sensor electrode 112. In this way, control circuit 121 is capable of detecting whether the hand of the user comes in contact with steering wheel 3, on the basis of the signal outputted from sensor electrode 112 to indicate the change in capacitance.

Power circuit 122 is electrically connected to control circuit 121 via lines 119a, 119b, and 119c, and is controlled by control circuit 121. Moreover, power circuit 122 is electrically connected to grounding electrode 114 via, for example, lines 119a, 119b, and 119c. Power circuit 122 is controlled by control circuit 121 and applies a measurement potential to sensor electrode 112.

Note that power circuit 122 may be controlled by control circuit 121 so that a direct current passes through grounding electrode 114. More specifically, the passage of the direct current may enable grounding electrode 114 to function as a heater. In this case, grounding electrode 114 is grounded because of the simple passage of the direct current, in contrast to sensor electrode 112 through which the alternating current passes. Here, the function of grounding electrode 114 is not limited to the heater. For example, grounding electrode 114 may be simply grounded without the passage of direct current.

[Manufacturing Method]

Next, a method of manufacturing capacitive sensor 100 is described.

Figure 8:
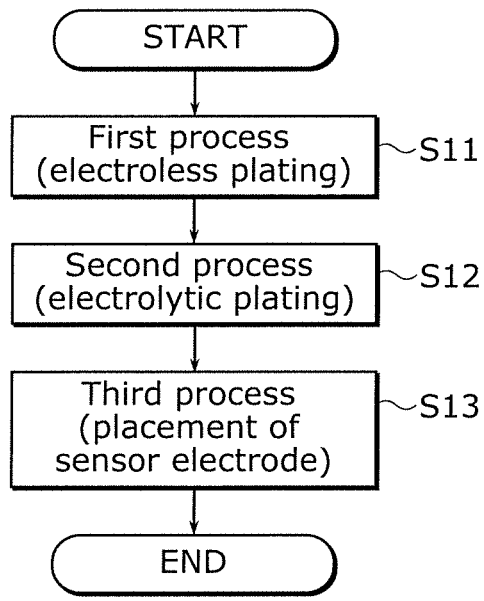
FIG. 8 is a flowchart illustrating a method of manufacturing the capacitive sensor according to Embodiment 1.

FIG. 8 is a flowchart illustrating the method of manufacturing capacitive sensor 100 according to Embodiment 1.

First, a mesh fabric having the plurality of warps 132a each of which is a strand and the plurality of wefts 132b each of which is a strand, an electroless plating solution, and an electrolytic plating device are prepared. The mesh fabric is woven of the plurality of warps 132a and the plurality of wefts 132b, and has openings 132c each formed by two adjacent warps among the plurality of warps 132a and two adjacent wefts among the plurality of wefts 132b. As illustrated in FIG. 8, the mesh fabric is soaked into the electroless plating solution to coat the surface of the mesh fabric with an electroless plating (S11: first process).

Next, the mesh fabric coated with the electroless plating in the first process is soaked into an electrolytic plating solution. Then, with the passage of current using the electrolytic plating device, the surface of the mesh fabric coated with the electroless plating is coated with an electrolytic plating. In this way, sensor electrode 112 is produced (S12: second process). Here, as the strand diameter of the conductive fabric increases and thus the area of the opening space decreases, an effective electrode area subjected to the electrolytic plating increases and thus a value of current required for the electrolytic plating increases. In view of a practical value of current that can be supplied by the electrolytic plating device that performs the electrolytic plating, a minimum area of the opening space of the opening of the conductive fabric is about 0.05 square millimeters, for example. If the area of the opening space is any smaller (for example, about 0.04 square millimeters), the current required for the electrolytic plating may not be able to be supplied. Thus, the strand diameter of the conductive fabric may be determined on the basis of a correlation between the value of current that can be supplied by the electrolytic plating device that performs the electrolytic plating and the area of the opening space.

Next, sensor electrode 112 is disposed on frontside 113a of substrate 113, which is in the form of a sheet (S13: third process). In this way, capacitive sensor 100 is manufactured.

[Experimental Result]

The following describes a difference in resistance between a mesh fabric coated with an electroless plating and a mesh fabric coated with an electrolytic plating.

Figure 9:
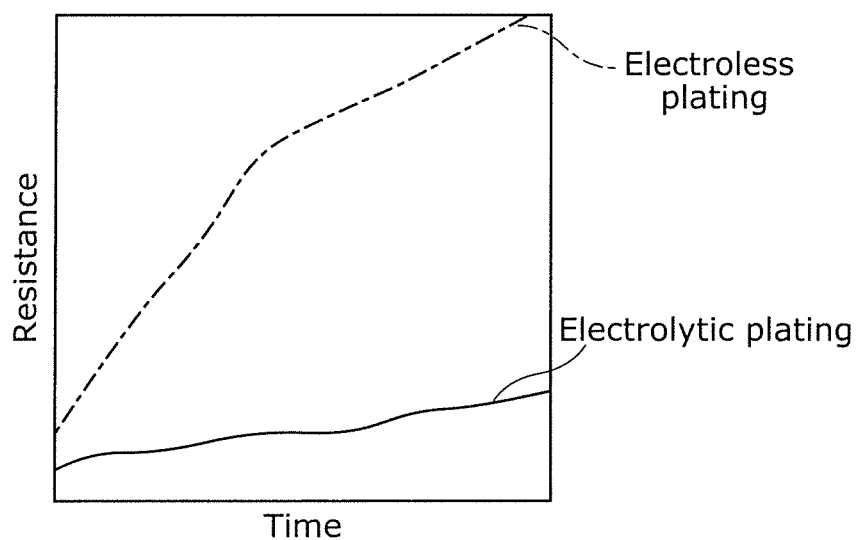
FIG. 9 illustrates a relationship between resistance and time for a mesh fabric coated with an electroless plating and a mesh fabric coated with an electrolytic plating.

FIG. 9 illustrates a relationship between resistance and time for a mesh fabric coated with an electroless plating and a mesh fabric additionally coated with an electrolytic plating (i.e., illustrates a corrosion resistance comparison). The case of applying only the electroless plating is indicated by an alternate long and short dash line and the case of additionally applying the electrolytic plating is indicated by a solid line.

The result in FIG. 9 indicates that the resistance of the mesh fabric coated with only the electroless plating increases as time proceeds at a greater rate as compared with the resistance of the mesh fabric additionally coated with the electrolytic plating. On this account, the mesh fabric for sensor electrode 112 is also additionally coated with the electrolytic plating.

Comparative Example

Next, a plain-woven fabric according to a comparative example is described with reference to FIG. 10 and FIG. 11.

FIG. 10 is a partially enlarged cross-sectional view of warp 191a and weft 191b of plain-woven fabric 191, which is a typical fabric, according to the comparative example. FIG. 11 is a partially enlarged cross-sectional view of plain-woven fabric 191, illustrating warp 191a taken along line X-X of FIG. 10 and a side surface of weft 191b. The following describes plain-woven fabric 191 that is coated with a metal plating and thus conductive, as with sensor electrode 112 according to the present embodiment.

As illustrated in FIG. 10, plain-woven fabric 191 according to the comparative example includes a plurality of warps 191a each of which is in the form of a sheet and a plurality of wefts 191b each of which is in the form of a sheet.

Each of the plurality of warps 191a and the plurality of wefts 191b is a thread in the form of a sheet made of bound or entwined lines. Thus, warp 191a and weft 191b are not strands.

An area defined by a maximum outside diameter, indicated by a long dashed double-short dashed line, of one warp 191a among the plurality of warps 191a in cross section along a plane perpendicular to the longitudinal direction of warp 191a is larger than an area of an opening space of the opening. Moreover, area B2 defined by a maximum outside diameter of one weft 191b among the plurality of wefts 191b in cross section along a plane perpendicular to the longitudinal direction of weft 191b is larger than area B1 of the opening space of the opening. Note that, in FIG. 10, area B2 indicated by a long dashed double-short dashed line is illustrated simply for comparison with B1 indicated by a long dashed double-short dashed line.

Figure 11:
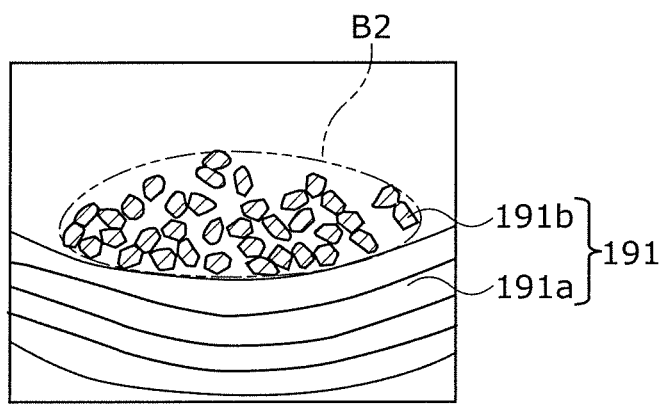
FIG. 11 is a partially enlarged cross-sectional view of the plain-woven fabric, illustrating the warp taken along line X-X of FIG. 10 and a side surface of the weft.

As illustrated in the cross-sectional view of plain-woven fabric 191 in FIG. 11, each of warp 191a and weft 191b has interstices between the lines. More specifically, a line density per unit area for each of warp 191a and weft 191b is smaller than that for each of warp 132a and weft 132b of sensor electrode 112 according to the present embodiment.

Plain-woven fabric 191 according to this comparative example has more interstices than warp 132a and weft 132b of sensor electrode 112 according to the present embodiment. Thus, plain-woven fabric 191 tends to produce cracks when pulled in the stretching direction. A plain-woven fabric does not extend by changing the shape of the openings in response to the stretching stress. Instead, this stress is directly applied to the warp and the weft of the plain-woven fabric, which thus tends to produce cracks.

Moreover, plain-woven fabric 191 according to this comparative example has unstable contact resistance of a contact point between wrap 191a and weft 191b. For this reason, the resistance of the contact point is likely to increase. A value of current required for applying a metal plating on warp 191a and weft 191b by electrolytic plating is determined by a surface area of an object subjected to the plating. Thus, the value of current for the electrolytic plating increases for plain-woven fabric 191 having a larger surface area subjected to the plating per unit area of the fabric than a mesh fabric. This makes it difficult to perform the electrolytic plating on warp 191a and weft 191b. Even if the metal plating is allowed to be applied on warp 191a and weft 191b by the electrolytic plating, the manufacturing cost of plain-woven fabric 191 escalates unfortunately.

Advantageous Effects

As described thus far, capacitive sensor 100 according to the present embodiment includes: substrate 113 that is in the form of a sheet and has frontside 113a and backside 113b; and sensor electrode 112 that is capacitive and disposed on frontside 113a of substrate 113. Sensor electrode 112 includes the plurality of warps 132a each of which is a strand and the plurality of wefts 132b each of which is a strand. Sensor electrode 112 is a conductive fabric made by applying a metal plating on a mesh fabric that is woven of the plurality of warps 132a and the plurality of wefts 132b and that has openings 132c each formed by two adjacent warps among the plurality of warps 132a and two adjacent wefts among the plurality of wefts 132b. Moreover, area A1 defined by a maximum outside diameter of one warp 132a among the plurality of warps 132a or one weft 132b among the plurality of wefts 132b in cross section along a plane perpendicular to the longitudinal direction of warp 132a or weft 132b is smaller than area A2 of the opening space of opening 132c.

As described above, the area defined by the maximum outside diameter of warp 132a or weft 132b in cross section is smaller than area A2 of the opening space of opening 132c. Thus, sensor electrode 112, which is a mesh, has a high proportion of openings 132c per unit area. If capacitive sensor 100 is stretched, sensor electrode 112 also comes under stretching stress and is thus easily stretched. More specifically, sensor electrode 112 is stretched in response to the stretching stress by changing the shape of openings 132c. Thus, the stretching stress is less likely to act on the plurality of warps 132a and the plurality of wefts 132b. As compared with a non-woven fabric, sensor electrode 112 is unlikely to have cracks when stretched because the plurality of warps 132a and the plurality of wefts 132b are strands. Thus, reduction of cracks in sensor electrode 112 can keep the resistance from increasing.

Hence, the reliability of sensing accuracy of sensor electrode 112 of capacitive sensor 100 can be kept from deceasing.

In particular, when capacitive sensor 112 is stretched, contact pressure increases for both warp 132a and weft 132b. This stabilizes the contact pressure at each of contact points P between the plurality of warps 132a and the plurality of wefts 132b and thus further enhances the robustness of sensor electrode 112.

A method of manufacturing capacitive sensor 100 including a plurality of warps 132a each of which is a strand and a plurality of wefts 132b each of which is a strand according to the present embodiment includes: applying an electroless plating on a mesh fabric that is woven of the plurality of warps 132a and the plurality of wefts 132b and has openings 132c each formed by two adjacent warps 132a among the plurality of warps 132a and two adjacent wefts 132b among the plurality of wefts 132b; producing sensor electrode 112 by applying an electrolytic plating on the mesh fabric having been applied with the electroless plating in the applying; and disposing sensor electrode 112 on frontside 113a of substrate 113 that is in the form of a sheet. An area defined by one of (i) a maximum outside diameter of warp 132a among the plurality of warps 132a in cross section along a plane perpendicular to a longitudinal direction of warp 132a and (ii) a maximum outside diameter of weft 132b among the plurality of wefts 132b in cross section along a plane perpendicular to a longitudinal direction of weft 132b, is smaller than an area of an opening space of each of openings 132c.

This manufacturing method can also achieve advantageous effects similar to those described above.

Sensor electrode 112 of capacitive sensor 100 is bonded to frontside 113a of substrate 113 to be fixed to substrate 113, according to the present embodiment. An elongation rate of sensor electrode 112 obtained when only sensor electrode 112 is stretched is greater than an elongation rate of substrate 113 obtained when only substrate 113 is stretched.

As described above, when capacitive sensor 100 is stretched and elongated, sensor electrode 112 can be stretched as much as substrate 113 can. This further keeps cracks from occurring to sensor electrode 112.

A direction in which sensor electrode 112 of capacitive sensor 100 is stretched forms an acute angle of about 45 degrees with a longitudinal direction of the plurality of warps 132a and with a longitudinal direction of the plurality of wefts 132b, according to the present embodiment.

As described above, the stretching stress is applied to sensor electrode 112 so that the stretching direction forms the acute angle of about 45 degrees with the longitudinal direction of the plurality of warps 132a and the longitudinal direction of the plurality of wefts 132b. Thus, the elongation rate of sensor electrode 112 can be maintained, and capacitive sensor 100 can be easily elongated when stretched. This keeps cracks, which may be caused by the stretching stress, from occurring to sensor electrode 112 more reliably.

A direction in which substrate 113 of capacitive sensor 100 is stretched forms an acute angle of about 45 degrees with a longitudinal direction of the plurality of warps 132a and with a longitudinal direction of the plurality of wefts 132b, according to the present embodiment. Substrate 113 is fixed to equipment in a stretched state.

As described above, sensor electrode 112 is fixed to substrate 113 so that the stretching direction forms the acute angle of about 45 degrees with the longitudinal direction of the plurality of warps 132a and the longitudinal direction of the plurality of wefts 132b. More specifically, sensor electrode 112 is stretched as substrate 113 is stretched. This keeps cracks from occurring to sensor electrode 112 of capacitive sensor 100 more reliably.

For capacitive sensor 100 according to the present embodiment, the metal plating is achieved by applying an electroless copper plating on frontside 113a of the mesh fabric and then further applying an electrolytic nickel plating on the mesh fabric.

After the application of the electroless plating, the electrolytic plating is applied to the mesh fabric having the plurality of warps 132a and the plurality of wefts 132b each of which is a strand. Thus, the plating is achieved while a contact pressure between warp 132a and weft 132b is maintained sufficiently. This enhances the contact pressure at each of contact points P between the plurality of warps 132a and the plurality of wefts 132b and thus further improves the robustness of sensor electrode 112.

Moreover, unlike a case where only an electroless plating is applied to the mesh fabric, sensor electrode 112 according to the present embodiment has high crystalline nature and high corrosion resistance. This can reduce an increase in resistance of sensor electrode 112 caused by corrosion in an actual usage environment.

Furthermore, the mesh fabric having applied with the electroless plating has a high proportion of openings 132c per unit area. Thus, as compared with a conventional non-woven fabric, an area to be plated is smaller and a current required for electrolytic plating is also relatively smaller. This prevents an increase in power consumption required for electrolytic plating. Hence, the manufacturing cost of capacitive sensor 100 including sensor electrode 112 can be kept from escalating.

Moreover, the metal plating is achieved by applying the electrolytic plating on the mesh fabric having been applied with the electroless plating. Thus, the metal plating having high crystalline nature can be formed on the surface of the mesh fabric without, for example, annealing treatment. This is suitable especially when the mesh fabric is a resin, for example.

Furthermore, the mesh fabric covered with the electrolytic nickel plating after applied with the electroless copper plating can be prevented from oxidation of copper plating.

In addition, continuity of contact point P between warp 132a and weft 132b can be improved.

Maximum width L1 of each of openings 132c in capacitive sensor 100 is smaller than a width of a human finger, according to the present embodiment.

In this way, sensor electrode 112 is capable of reliably detecting the presence of the human finger. This enables capacitive sensor 100 to maintain the sensing accuracy.

As seen from a top view of sensor electrode 112 of capacitive sensor 100 according to the present embodiment, first area 112d of contact point P where warp 132a and weft 132b overlap each other is smaller than second area A2 that is the area of the opening space of each of openings 132c.

Thus, unlike a case where first area 112d is larger than second area A2, openings 132c are allowed to change more in shape and thus sensor electrode 112 can maintain the elongation rate when stretched. This keeps cracks from occurring to sensor electrode 112 of capacitive sensor 100 more reliably.

Capacitive sensor 100 further includes control circuit 121 that is electrically connected to sensor electrode 112, according to the present embodiment. Sensor electrode 112 is disposed on steering wheel 3 and detects contact between a human body and steering wheel 3. Control circuit 121 is electrically connected to sensor electrode 112 via which control circuit 121 detects the contact between the human body and steering wheel 3.

In this way, the electrical connection between sensor electrode 112 and control circuit 121 enables detection of contact or grip performed on steering wheel 3.

Openings 132c of capacitive sensor 100 in another aspect according to the present disclosure have roughly the same shape and are arranged regularly in the longitudinal direction of warp 132a and the longitudinal direction of weft 132b.

Thus, when capacitive sensor 100 in the stretched state is wrapped around steering wheel 3, openings 132c come under the stretching stress and partially under compression stress and thus change in shape in a roughly regular manner. Then, contact points P between warps 132a and wefts 132b also come under roughly the same stress. This keeps cracks from occurring to sensor electrode 112 more reliably.

Embodiment 2

[Configuration: Capacitive Sensor 100a]

Figure 12:
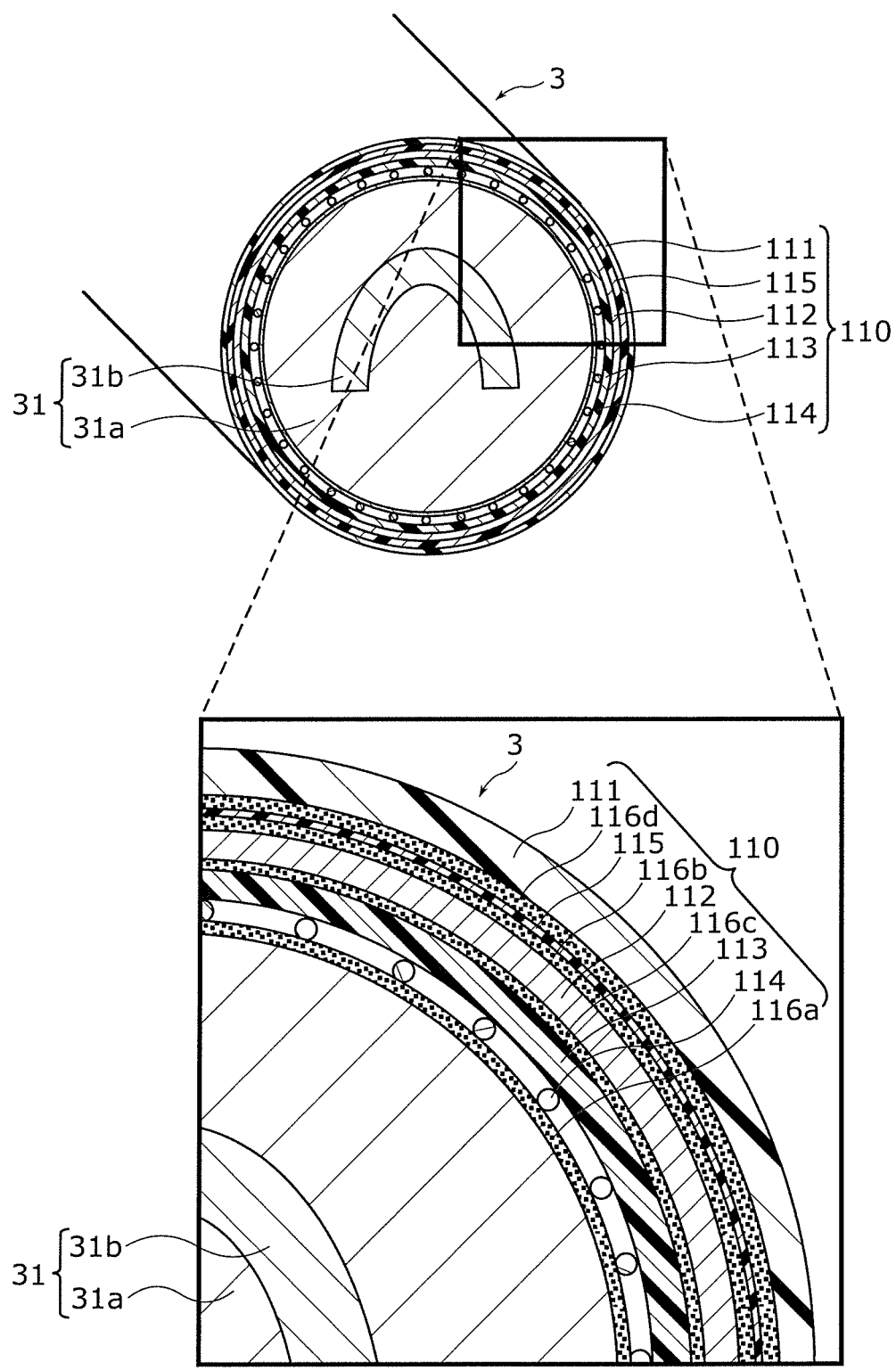
FIG. 12 illustrates a cross-sectional view of a steering cover and a rim wrapped with the steering cover taken along line II-II of FIG. 1, and also illustrates a partially enlarged cross-sectional view of the rim and the steering cover.

FIG. 12 illustrates a cross-sectional view of steering cover 110 and rim 31 wrapped with steering cover 110 taken along line II-II of FIG. 1, and also illustrates a partially enlarged cross-sectional view of rim 31 and steering cover 110.

As illustrated in FIG. 12, rim 31 is a ring-shaped part to be gripped by a hand of a user (human). Rim 31 includes: core bar 31b that is a metallic annular ring core; and resin layer 31a that covers core bar 31b. Rim 31 is wrapped with steering cover 110.

Figure 13:
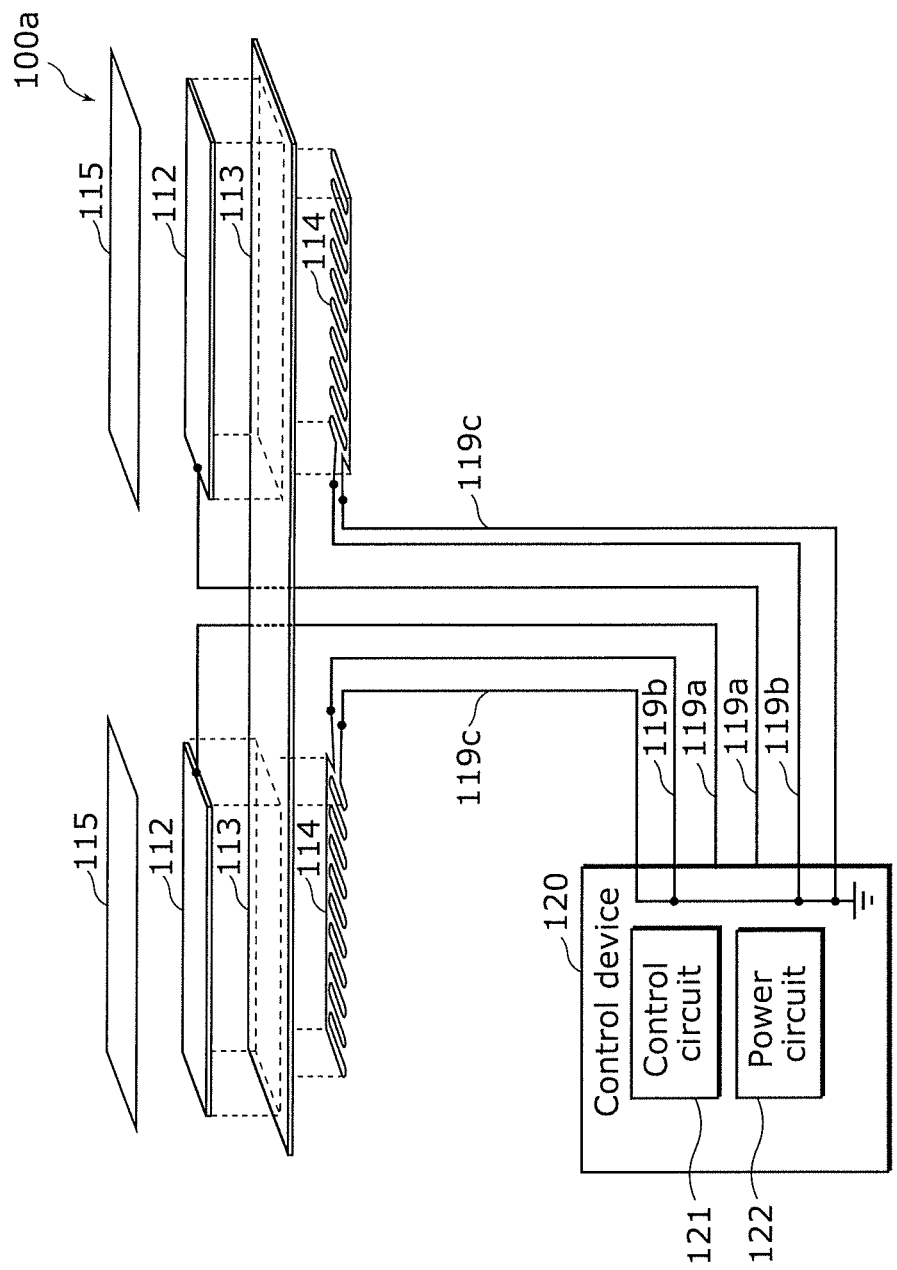
FIG. 13 is a block diagram of a configuration of a capacitive sensor according to Embodiment 2.

FIG. 13 is a block diagram of a configuration of capacitive sensor 100a according to Embodiment 2.

As illustrated in FIG. 12 and FIG. 13, capacitive sensor 100a includes surface layer 111, moisture-proof layer 115, a pair of sensor electrodes 112, substrate 113, grounding electrode 114, and control device 120. Moreover, capacitive sensor 100a includes adhesive 116a, first adhesive layer 116b, second adhesive layer 116c, and third adhesive layer 116d. Note that adhesive 116a, first adhesive layer 116b, second adhesive layer 116c, and third adhesive layer 116d may or may not be included as components of capacitive sensor 100a.

Moisture-proof layer 115 is a sheet or film applied with a moisture-corrosion-proof coating, for example. For instance, moisture-proof layer 115 is non-metallic, and is a resin, such as polyvinylidene. Moisture-proof layer 115 is lower in moisture permeability than first adhesive layer 116b and second adhesive layer 116c. In the present embodiment, the moisture permeability of moisture-proof layer 115 is about one fortieth or less of that of surface layer 111, for example.

Moisture-proof layer 115 is disposed on a backside of surface layer 111 and on a frontside of substrate 113. In other words, moisture-proof layer 115 is interposed between surface layer 111 and substrate 113. To be more specific, moisture-proof layer 115 is affixed to the backside of surface layer 111 with third adhesive layer 116d to be on the backside of surface layer 111. Third adhesive layer 116d is bonded to a frontside of moisture-proof layer 115. First adhesive layer 116b is bonded to a backside of moisture-proof layer 115. In other words, moisture-proof layer 115 is interposed between first adhesive layer 116b and third adhesive layer 116d.

Figure 14:
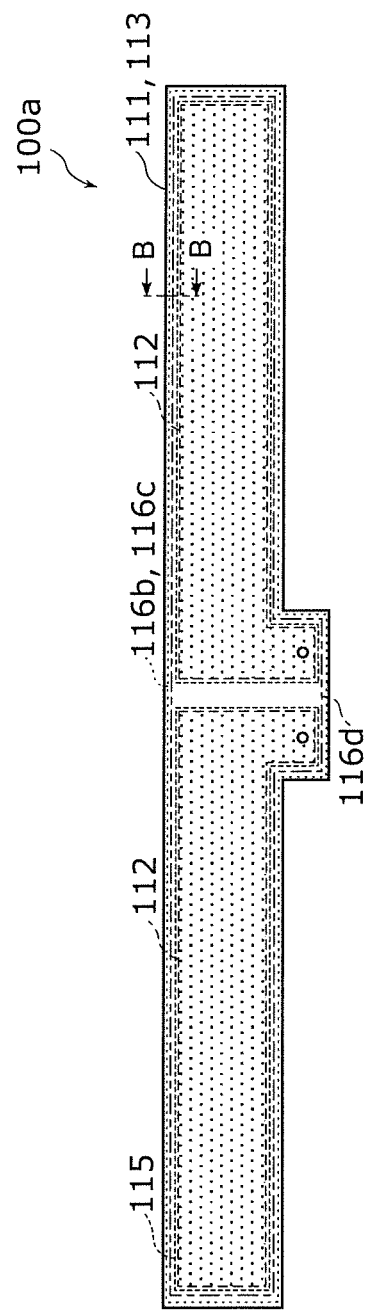
FIG. 14 illustrates a top view of laminated layers including a surface layer, a third adhesive layer, a moisture-proof layer, a first adhesive layer, a sensor electrode, a second adhesive layer, and a substrate.
Figure 15:
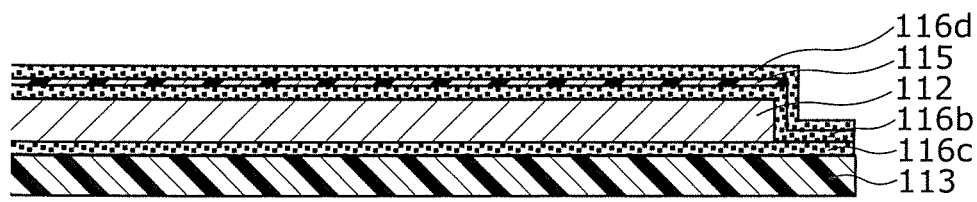
FIG. 15 is a cross-sectional view illustrating an end edge part of a steering cover taken along line B-B of FIG. 14.

FIG. 14 illustrates a top view of laminated layers including surface layer 111, third adhesive layer 116d, moisture-proof layer 115, first adhesive layer 116b, sensor electrode 112, second adhesive layer 116c, and substrate 113. FIG. 15 is a cross-sectional view illustrating an end edge part of steering cover 110 taken along line B-B of FIG. 14. Here, surface layer 111 is omitted from FIG. 15.

As illustrated in FIG. 14 and FIG. 15, moisture-proof layer 115 is covered and sealed with first adhesive layer 116b and third adhesive layer 116d as also seen from the view in which moisture-proof layer 115, first adhesive layer 116b, and third adhesive layer 116b are laminated. The frontside of moisture-proof layer 115 is opposite to the backside of surface layer 111 across third adhesive layer 116d.

Moisture-proof layer 115 has a thickness smaller than that of first anomaly detection 116b and that of second adhesive layer 116c. In the present embodiment, the thickness of moisture-proof layer 115 is, for example, about one tenth of that of first adhesive layer 116b and that of second adhesive layer 116c. In the present embodiment, moisture-proof layer 115 may be thinner than third adhesive layer 116b. In this case, the thickness of moisture-proof layer 115 may also be, for example, about one tenth of that of third adhesive layer 116d.

As seen from the view in which moisture-proof layer 115, third adhesive layer 116d, and surface layer 111 are laminated, moisture-proof layer 115 is covered with third adhesive layer 116d. In this case, a surface area of moisture-proof layer 115 is smaller than that of third adhesive layer 116d.

Third adhesive layer 116d bonds the frontside of moisture-proof layer 115 and the backside of surface layer 111 together, and thus is interposed between moisture-proof layer 115 and surface layer 111. An outer region of third adhesive layer 116d is affixed to first adhesive layer 116b and second adhesive layer 116c. More specifically, as seen from the view in which first adhesive layer 116b, second adhesive layer 116c, and third adhesive layer 116d are laminated, third adhesive layer 116d is covered with first adhesive layer 116b and second adhesive layer 116c. In this case, a surface area of third adhesive layer 116d is smaller than or equal to that of first adhesive layer 116b and that of second adhesive layer 116c. Each of first adhesive layer 116b, second adhesive layer 116c, and third adhesive layer 116d is an adhesive or a double-stick tape, for example. Third adhesive layer 116d may be made of an acrylic adhesive.

Note that single sensor electrode 112 or a plurality of sensor electrodes 112 may be disposed on substrate 113. The number of sensor electrodes 112 may not necessarily be the same as the number of grounding electrodes 114. FIG. 13 illustrates that one pair of sensor electrodes 112 and one pair of grounding electrodes 114 are provided. The following description is based on this diagram.

The pair of sensor electrodes 112 is disposed on the backside of moisture-proof layer 115 and on the frontside of substrate 113. In other words, the pair of sensor electrodes 112 is interposed between moisture-proof layer 115 and substrate 113. To be more specific, the pair of sensor electrodes 112 is bonded to the backside of moisture-proof layer 115 with first adhesive layer 116*b* to be on the backside of moisture-proof layer 115. First adhesive layer 116*b* is bonded to a frontside of the pair of sensor electrodes 112. Second adhesive layer 116*c* is bonded to a backside of the pair of sensor electrodes 112. In other words, the pair of sensor electrodes 112 is interposed between first adhesive layer 116*b* and second adhesive layer 116*c*. The frontside of the pair of sensor electrodes 112 is opposite to the backside of moisture-proof layer 115 across first adhesive layer 116*b*.

As seen from the view in which the pair of sensor electrodes 112, moisture-proof layer 115, and substrate 113 are laminated, a surface area of the pair of sensor electrodes 112 (a total of two surface areas corresponding to the pair) is smaller than that of moisture-proof layer 115 and that of substrate 113. To be more specific, the pair of sensor electrodes 112 is covered with moisture-proof layer 115, substrate 113, first adhesive layer 116*b*, second adhesive layer 116*c*, and third adhesive layer 116*d*.

One of the pair of sensor electrodes 112 is disposed at one end part of capacitive sensor 100*a* wrapped around rim 31 (disposed on the right side as rim 31 is viewed from the front, for example). The other of the pair of sensor electrodes 112 is disposed at the other end part of capacitive sensor 100*a* wrapped around rim 31 (disposed on the left side as rim 31 is viewed from the front, for example).

Substrate 113 is disposed opposite to moisture-proof layer 115 across sensor electrode 112, and disposed on a surface of grounding electrode 114 opposite to sensor electrode 112. In other words, substrate 113 is interposed between sensor electrode 112 and grounding electrode 114. To be more specific, substrate 113 is affixed to a backside of sensor electrode 112 with second adhesive layer 116*c* to be on the backside of sensor electrode 112. Second adhesive layer 116*c* is bonded to the frontside of substrate 113. Grounding electrode 114 is disposed on the backside of substrate 113. In other words, substrate 113 is interposed between second adhesive layer 116*c* and grounding electrode 114. As seen from the view in which substrate 113 and second adhesive layer 116*c* are laminated, substrate 113 is covered with second adhesive layer 116*c*. The frontside of substrate 113 is opposite to the backside of sensor electrode 112 across second adhesive layer 116*c*.

Grounding electrode 114 is a metallic wire (a conductive wire), such as a copper wire. Grounding electrode 114 is electrically connected to control device 120 via lines 119*b* and 119*c*, and is grounded.

Control circuit 121 includes a sensor circuit that detects contact between the hand of the user and steering wheel 3. Control circuit 121 is electrically connected to one of sensor electrodes 112. Control circuit 121 is electrically connected to the other of sensor electrodes 112. To be more specific, control circuit 121 passes an alternating current through one of sensor electrodes 112 via line 119*a*, that is, applies a measurement potential to one of sensor electrodes 112.

Moreover, control circuit 121 passes an alternating current through the other of sensor electrodes 112 via line 119*a*, that is, applies a measurement potential to the other of sensor electrodes 112. Control circuit 121 is electrically connected to sensor electrode 112 via line 119*a*. More specifically, control circuit 121 passes an alternating current through the other of sensor electrodes 112 via line 119*a*, that is, applies a measurement potential to the other of sensor electrodes 112.

If no contact is detected while vehicle 1 is driven, control circuit 121 may instruct the warning devices to alert the driver. For example, the warning device, such as the speaker, may alert the driver by using a beep sound or a voice warning. Moreover, the display device may display a warning message urging the driver to grip steering wheel 3 firmly.

Advantageous Effect

As described thus far, capacitive sensor 100*a* according to the present disclosure further includes: surface layer 111 that comes in contact with a human hand; and moisture-proof layer 115 that is disposed on a backside of surface layer 111. Sensor electrode 112 is disposed opposite to surface layer 111 across moisture-proof layer 115. Substrate 113 is disposed opposite to moisture-proof layer 115 across sensor electrode 112. Moisture-proof layer 115 and sensor electrode 112 are bonded together with first adhesive layer 116*b*. Sensor electrode 112 and substrate 113 are bonded together with second adhesive layer 116*c*. Moisture-proof layer 115 is lower in moisture permeability than first adhesive layer 116*b* and second adhesive layer 116*c*.

For example, by the contact between the hand of the user and the surface layer, moisture from, for instance, perspiration of the hand (such as moisture vapor) may be mixed with residues contained in the material of the surface layer to turn into acidic corrosive water. Such corrosive water may penetrate into the capacitive sensor to reach the sensor electrode. In this case, the sensor electrode may be corroded by this corrosive water.

However, moisture-proof layer 115 is disposed on the backside of surface layer 111 and interposed between surface layer 111 and sensor electrode 112, according to the present embodiment. To be more specific, moisture-proof layer 115 is closer to the outside than sensor electrode 112 is. Moreover, moisture-proof layer 115 is lower in moisture permeability than first adhesive layer 116*b* and second adhesive layer 116*c*. Thus, even if surface layer 111 is in a condition of high temperature and humidity because the hand of the user comes in contact with surface layer 111, moisture-proof layer 115 can keep moisture given by the hand of the user from reaching sensor electrode 112.

In this way, sensor electrode 112 of capacitive sensor 100*a* can be protected from corroding.

Each of first adhesive layer 116*b* and second adhesive layer 116*c* of capacitive sensor 100*a* is a substrate-less double-stick tape, according to the present embodiment.

Capacitive sensor 100*a* is stretched more easily than a capacitive sensor including a double-stick tape having a substrate. More specifically, when capacitive sensor 100*a* including the substrate-less double-stick tape is stretched, openings 132*c* of sensor electrode 112 are not prevented unduly from changing in shape. This can maintain a constant elongation rate of capacitive sensor 100*a*.

Moreover, moisture-proof layer 115 and sensor electrode 112 can be boned together easily. In addition, sensor electrode 112 and substrate 113 can be boned together easily. This results in an improvement in workability for attaching capacitive sensor 100a.

Moisture-proof layer 115 of capacitive sensor 100a has a thickness smaller than a thickness of first adhesive layer 116b and than a thickness of second adhesive layer 116c, according to the present embodiment.

Thus, the thickness of steering cover 100 of capacitive sensor 100a according to the present embodiment is not so different from that of a steering cover of a capacitive sensor including no moisture-proof layer 115. For this reason, when capacitive sensor 100a is to be wrapped around rim 31 of steering wheel 3 of vehicle 1, the increase in the thickness of capacitive sensor 100a hardly causes any problems in the wrapping operation. Moreover, unevenness in level is small around the perimeter of moisture-proof layer 115, which reduces discomfort of driver holding steering wheel 3.

As seen from a top view in which sensor electrode 112, moisture-proof layer 115, and substrate 113 of capacitive sensor 100a are laminated, an area of sensor electrode 112 is smaller than an area of moisture-proof layer 115 and than an area of substrate 113, according to the present embodiment. Sensor electrode 112 is covered with first adhesive layer 116b and second adhesive layer 116c.

Thus, even if surface layer 111 is in a condition of high temperature and humidity, corrosive water hardly reaches sensor electrode 112 that is covered and interposed between first adhesive layer 116b and second adhesive layer 116c. As a result, sensor electrode 112 of capacitive sensor 100a can be protected from corroding more reliably.

Surface layer 111 and moisture-proof layer 115 of capacitive sensor 100a are bonded together with the third adhesive layer, according to the present embodiment. An outer region of the third adhesive layer is bonded to first adhesive layer 116b and second adhesive layer 116c.

Thus, sensor electrode 112 is sealed with third adhesive layer 116d, first adhesive layer 116b, and second adhesive layer 116c, and thus corrosive water hardly reaches sensor electrode 112. As a result, sensor electrode 112 of capacitive sensor 100a can be protected from corroding more reliably.

Capacitive sensor 100a further includes a grounding electrode that is disposed opposite to sensor electrode 112 across substrate 113, according to the present embodiment.

For example, in capacitive sensor 100a to be wrapped around rim 31 of the steering, a distance between grounding electrode 114 and sensor electrode 112 is smaller than a distance between conductive core bar 31b of rim 31 and sensor electrode 112. Thus, a first capacitance between grounding electrode 114 and sensor electrode 112 is greater than a second capacitance between core bar 3b and sensor electrode 112. To be more specific, contact between the surface layer and the hand of the user is detected based on a sum of capacitance from the hand to the sensor electrode and capacitance from the sensor electrode to the grounding electrode. This increases the sensitivity and thus further keeps the sensing accuracy of capacitive sensor 100a from deceasing.

Figure 16A:
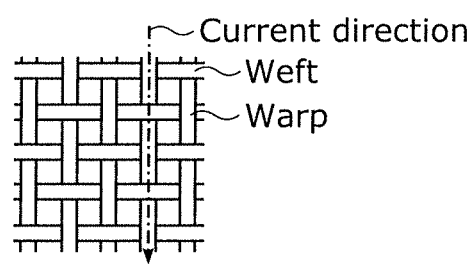
FIG. 16A schematically illustrates that a current pathway is conducting along a wrap or weft in a sensor electrode of the capacitive sensor according to Embodiment 2.
Figure 16B:
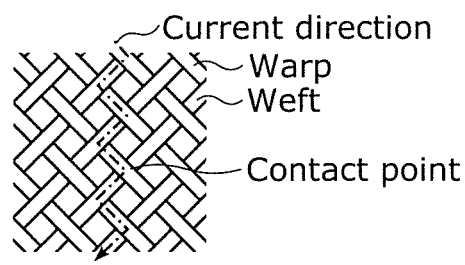
FIG. 16B schematically illustrates that a current pathway is conducting depending on contact points between wraps and wefts in the sensor electrode of the capacitive sensor according to Embodiment 2.

FIG. 16A schematically illustrates that a current pathway is conducting along the wrap or weft in sensor electrode 112 of capacitive sensor 100a according to Embodiment 2. FIG. 16B schematically illustrates that a current pathway is conducting depending on contact points between the wraps and the wefts in sensor electrode 112 of capacitive sensor 100a according to Embodiment 2.

For example, if a conductive fabric is made of warps and wefts and the sensor electrode is included in the conductive fabric that is cut along the warps or wefts as illustrated in FIG. 16A, a current path is conducting along the warp or weft. This enables the sensor electrode to detect contact between the surface layer and the hand of the user. In contrast, if the sensor electrode is included in the conductive fabric that is not cut along the warps or wefts as illustrated in FIG. 16B for example, that is, if the sensor electrode is included in the conductive fabric that is cut in a direction crossing the warps and wefts, the current pathway is conducting depending on contact points between the wraps and the wefts. In this case, after conduction becomes difficult at the contact points between the warps and the wefts due to corrosion of the warps and wefts, the sensor electrode has difficulty in detecting contact between the surface layer and the hand of the user.

On the other hand, capacitive sensor 100a according to the present embodiment includes moisture-proof layer 115 that protects sensor electrode 112 against corrosion. Hence, regardless of the direction in which the conductive fabric is cut or placed, sensor electrode 112 is capable of detecting contact between surface layer 111 and the hand of the user.

Moreover, third adhesive layer 116d of capacitive sensor 100a according to the present embodiment is a substrate-less double-stick tape.

Thus, surface layer 111 and moisture-proof layer 115 can be boned together without loss of extensibility. This results in an improvement in workability for attaching capacitive sensor 100a.

Embodiment 3

[Configuration: Capacitive Sensor 100b]

Figure 17:
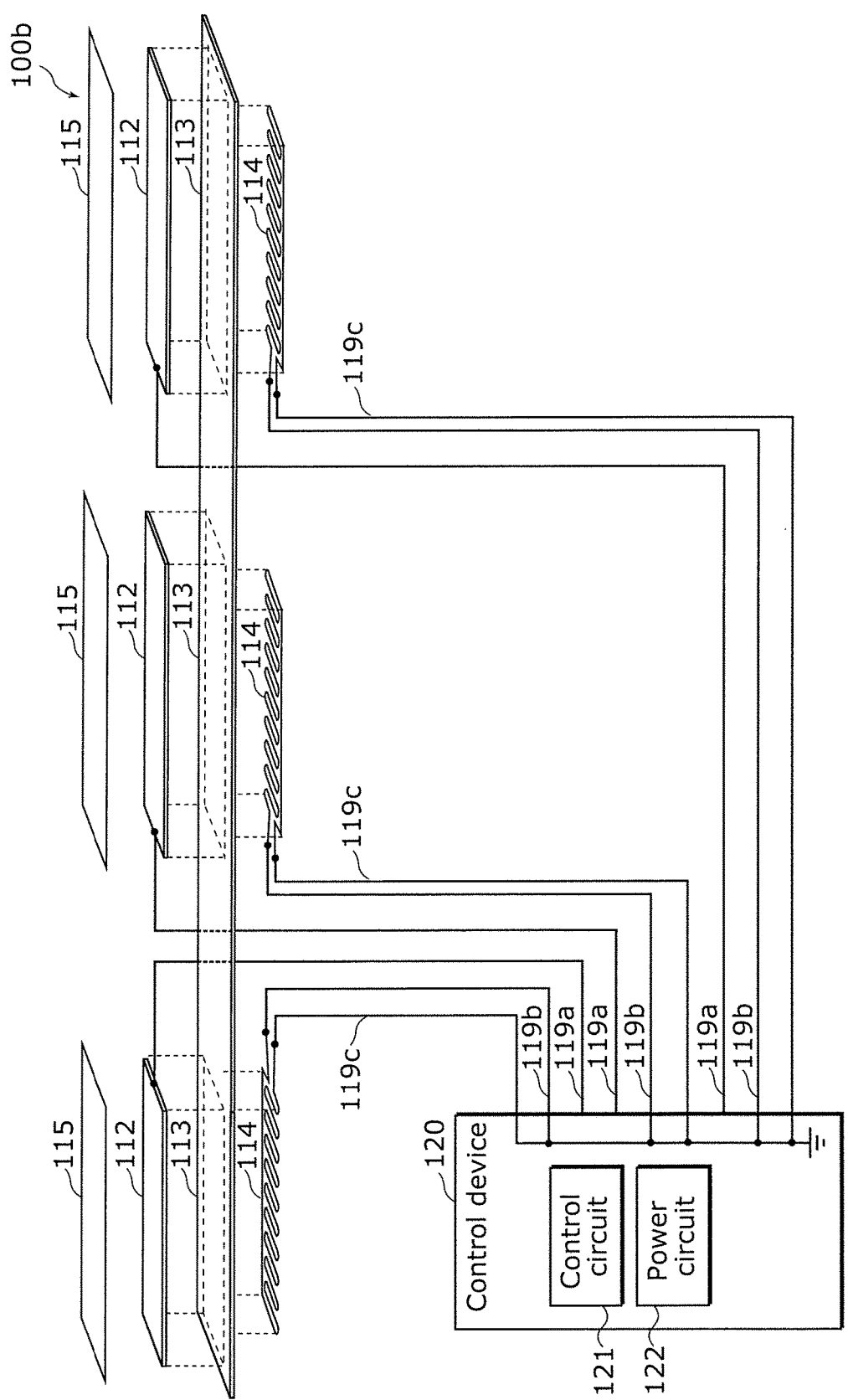
FIG. 17 is a block diagram of a configuration of a capacitive sensor according to Embodiment 3.
Figure 18:
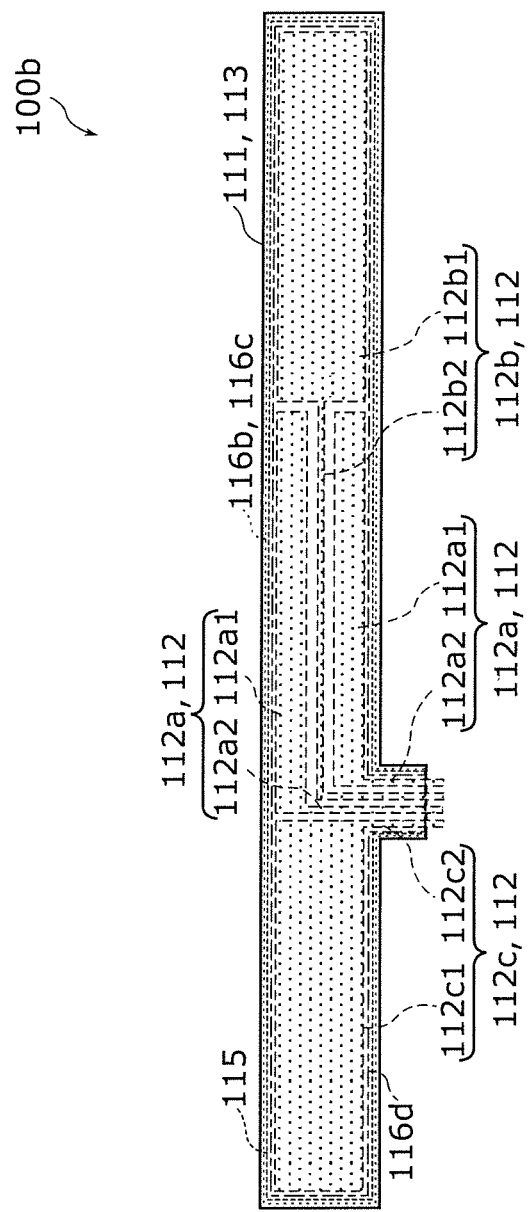
FIG. 18 illustrates a top view of laminated layers including a surface layer, a third adhesive layer, a moisture-proof layer, a first adhesive layer, a sensor electrode, a second adhesive layer, and a substrate.

FIG. 17 is a block diagram of a configuration of capacitive sensor 100b according to the present embodiment. Note that FIG. 17 illustrates an equivalent circuit of sensor electrode 112 and that an actual shape is illustrated in FIG. 18 described later. As illustrated in FIG. 17, capacitive sensor 100b includes surface layer 111, moisture-proof layer 115, sensor electrode 112, substrate 113, grounding electrode 114, and control device 120.

Note that single sensor electrode 112 or a plurality of sensor electrodes 112 may be disposed on a surface of substrate 113. The number of sensor electrodes 112 may not necessarily be the same as the number of grounding electrodes 114. FIG. 17 illustrates that a plurality of sensor electrodes 112 and a plurality of grounding electrodes 114 are provided. The following description is based on this diagram.

FIG. 18 illustrates a top view of laminated layers including surface layer 111, third adhesive layer 116d, moisture-proof layer 115, first adhesive layer 116b, the plurality of sensor electrodes 112, second adhesive layer 116c, and substrate 113. A cross-sectional view of an end edge part of steering cover 110 illustrated in FIG. 18 is the same as the view in FIG. 15, and thus description is presented with reference to FIG. 15.

As illustrated in FIG. 15 and FIG. 18, plurality sensor electrodes 112 are covered and sealed with first adhesive layer 116b and second adhesive layer 116c as also seen from the view in which first adhesive layer 116b, the plurality of sensor electrodes 112, and second adhesive layer 116c are laminated. Moreover, moisture-proof layer 115 is covered and sealed with first adhesive layer 116b and third adhesive layer 116d as seen from the view in which moisture-proof layer 115, first adhesive layer 116b, and third adhesive layer 116d are laminated. Here, peripheries of the plurality of sensor electrodes 112 are covered with first adhesive layer 116b and second adhesive layer 116c. Thus, except for first leads 112*a*2, second lead 112*b*2, and third lead 112*c*2 described later, the plurality of sensor electrodes 112 are surrounded by a part bonded to first adhesive layer 116*b* and second adhesive layer 116*c* (this part may be referred to as the offset region).

The plurality of sensor electrodes 112 are made by forming a first metal (first metal plating) on a surface of a fabric in which non-metallic fibers, such as polyethylene terephthalate (PET), are woven and then further forming a second metal (second metal plating) on a surface of the first metal plating.

The plurality of sensor electrode 112 are disposed on a backside of surface layer 111 and on a frontside of substrate 113. In other words, sensor electrodes 112 are interposed between surface layer 111 and substrate 113. To be more specific, the plurality of sensor electrodes 112 are affixed to the backside of surface layer 111 with first adhesive layer 116*b* to be on the backside of surface layer 111. First adhesive layer 116*b* is bonded to each frontside of the plurality of sensor electrodes 112, and second adhesive layer 116*c* is bonded to each backside of the plurality of sensor electrodes 112. In other words, the plurality of sensor electrodes are interposed between first adhesive layer 116*b* and second adhesive layer 116*c*. The frontside of the plurality of sensor electrodes 112 is opposite to the backside of surface layer 111 across first adhesive layer 116*b*.

As seen from the view in which the plurality of sensor electrodes 112 and substrate 113 are laminated, a surface area of the plurality of sensor electrodes 112 (a total of three surface areas corresponding to these electrodes) is smaller than that of substrate 113. To be more specific, the plurality of sensor electrodes 112 is covered with substrate 113, first adhesive layer 116*b*, and second adhesive layer 116*c*.

The plurality of sensor electrodes 112 are arranged in at least three positions along a circumference of steering wheel 3. In the present embodiment, the plurality of sensor electrodes 112 include first sensor electrode 112*a*, second sensor electrode 112*b*, and third sensor electrode 112*c*.

First sensor electrode 112*a* includes first electrode 112*a*1 and a pair of first leads 112*a*2. First sensor electrode 112*a* is an example of a first conductive fabric among a plurality of conductive fabrics.

First electrode 112*a*1 is disposed in a position near a predetermined position of substrate 113. This means that first electrode 112*a*1, which is disposed near the predetermined position, is closer to the predetermined position than second sensor electrode 112*b* is. In the present embodiment, first electrode 112*a*1 is located counterclockwise from the position near the predetermined position along the circumference of steering wheel 3.

To be more specific, first electrode 112*a*1 is divided into two that are arranged side by side in a direction perpendicular to a circumferential direction of steering wheel 3. More specifically, first electrode 112*a*1 is cut into two halves in the circumferential direction of steering wheel 3. One of first electrodes 112*a*1 and the other of first electrodes 112*a*1 are arranged in the direction perpendicular to the circumferential direction. One of first electrodes 112*a*1 and the other of first electrodes 112*a*1 are disposed along the circumference of steering wheel 3. Moreover, one of first electrodes 112*a*1 and the other of first electrodes 112*a*1 are disposed at a specified distance from each other so that these electrodes are not electrically connected directly to each other.

One of first electrodes 112*a*1 is electrically connected to control device 120 via one of first leads 112*a*2. More specifically, one of first leads 112*a*2 has one end that is electrically connected to one of first electrodes 112*a*1 and the other end that is electrically connected to the other of first leads 112*a*2, and is connected to control device 120 via a harness. The other of first electrodes 112*a*1 is electrically connected to control device 120 via the other of first leads 112*a*2. More specifically, the other of first leads 112*a*2 has one end that is electrically connected to the other of first electrode 112*a*1 and the other end that is electrically connected to the other of first leads 112*a*2, and is connected to control device 120 via a harness. Thus, electrical connection between one of first leads 112*a*2 and the other of first leads 112*a*2 enables signals from the two in the pair of first electrodes 112*a*1 to be one signal. Hence, the pair of first electrodes 112*a*1 functions as a single sensor electrode.

The pair of first leads 112*a*2 is disposed in or near a predetermined position of substrate 113. In the present embodiment, the pair of first leads 112*a*2 is disposed in a position corresponding to spoke 32 of steering wheel 3. To be more specific, a position in which the other end of one of first leads 112*a*2 is connected to the other end of the other of first leads 112*a*2 is near spoke 32. The pair of first leads 112*a*2 is connected to control device 120 via a harness included in spoke 32. First lead 112*a*2 is an example of a signal extractor.

Second sensor electrode 112*b* includes second electrode 112*b*1 and second lead 112*b*2.

Second electrode 112*b*1 is located farther from the predetermined position of substrate 113 than first electrode 112*a*1 is. To be more specific, second electrode 112*b*1 is located at a longer distance from the predetermined position than a distance between the predetermined position and first electrode 112*a*1. Second electrode 112*b*1 is interposed between first electrode 112*a*1 and third electrode 112*c*1, which is described later, along the circumference of steering wheel 3. Second sensor electrode 112*b* is an example of a second conductive fabric among the plurality of conductive fabrics.

Second electrode 112*b*1 is electrically connected to control device 120 via second lead 112*b*2. More specifically, second lead 112*b*2 has one end that is electrically connected to second electrode 112*b*1 and the other end that is connected to control device 120 via a harness.

Second lead 112*b*2 is a metallic wire, such as an insulation-coated copper wire. Second lead 112*b*2 is interposed between one of first electrodes 112*a*1 and the other of first electrodes 112*a*1, and extends from second electrode 112*b*1 to a predetermined position. To be more specific, second lead 112*b*2 extends from second electrode 112*b*1 to the predetermined position along between one of first electrodes 112*a*1 and the other of first electrodes 112*a*1 without being electrically connected to one of first electrodes 112*a*1 and the other of first electrodes 112*a*1. Second lead 112*b*2 is an example of a signal extractor of the second conductive fabric. Note that second lead 112*b*2 is not limited to the metallic wire, such as an insulation-coated copper wire, and may be made of the same material used for making second electrode 112*b*1.

Second lead 112*b*2 has a length longer than that of first lead 112*a*2 and that of third lead 112*c*2, which is described later. Moreover, second lead 112*b*2 is not electrically connected to first lead 112*a*2 and third lead 112*c*2.

Third sensor electrode 112*c* includes third electrode 112*c*1 and third lead 112*c*2.

Third electrode 112*c*1 is disposed in a position near the predetermined position of substrate 113. In the present embodiment, third electrode 112*c*1 is located clockwise from the position near the predetermined position along the circumference of steering wheel 3. More specifically, third electrode 112c1 is opposed to first electrode 112a1.

Third electrode 112c1 is electrically connected to control device 120 via third lead 112c2. More specifically, third lead 112c2 has one end that is electrically connected to third electrode 112c1 and the other end that is connected to control device 120 via a harness.

Third lead 112c2 is a metallic wire, such as an insulation-coated copper wire. Third lead 112c2 is in or near a predetermined position of substrate 113. In the present embodiment, third lead 112c2 is disposed in a position corresponding to spoke 32 of steering wheel 3. More specifically, third lead 112c2 is located near spoke 32. Third lead 112c2 is connected to control device 120 via a harness included in spoke 32. Moreover, third lead 112c2 is located near first lead 112a2 without being electrically connected to first lead 112a2.

Substrate 113 is affixed to a backside of sensor electrode 112 with second adhesive layer 116c to be on the backside of sensor electrode 112. Second adhesive layer 116c is bonded to a frontside of substrate 113, and grounding electrode 114 is disposed on a backside of substrate 113. In other words, substrate 113 is interposed between second adhesive layer 116c and grounding electrode 114. As seen from the view in which substrate 113 and second adhesive layer 116c are laminated, substrate 113 is covered with second adhesive layer 116c. The frontside of substrate 113 is opposite to the backside of sensor electrode 112 across second adhesive layer 116c.

In FIG. 17, grounding electrode 114 illustrated on the right side of the diagram among the plurality of grounding electrodes 114 corresponds to sensor electrode 112 illustrated on the right side of the diagram, and is located on the right side of capacitive sensor 100b wrapped around rim 31 in the diagram, for example. Similarly, grounding electrode 114 illustrated on the left side of the diagram among the plurality of grounding electrodes 114 corresponds to sensor electrode 112 illustrated on the left side of the diagram, and is located on the left side of capacitive sensor 100b wrapped around rim 31 in the diagram, for example. Similarly, grounding electrode 114 illustrated in the middle of the diagram among the plurality of grounding electrodes 114 corresponds to sensor electrode 112 illustrated in the middle of the diagram, and is located in the top of capacitive sensor 100b wrapped around rim 31, for example.

Control circuit 121 is electrically connected to three sensor electrodes 112 via three lines 119a. Control circuit 121 passes an alternating current through three sensor electrodes 112 via three lines 119a, that is, applies a measurement potential to three sensor electrodes 112. If the hand of the user comes in contact with surface layer 111 of rim 31, capacitance of sensor electrode 112 corresponding to a contact area changes. Control circuit 121 measures the change in capacitance of sensor electrode 112 on the basis of a value of current (measurement potential) passing through sensor electrode 112. In this way, control circuit 121 is capable of detecting whether the hand of the user comes in contact with steering wheel 3, on the basis of the signal outputted from sensor electrode 112 to indicate the change in capacitance.

Advantageous Effects

As described thus far, sensor electrode 112 of capacitive sensor 100b according to the present embodiment includes a plurality of conductive fabrics disposed in at least three locations along a circumferential direction of steering wheel 3. Each of the plurality of conductive fabrics includes an electrode and a signal extractor extending from the electrode to a predetermined position. The plurality of conductive fabrics includes first sensor electrode 112a located closer to the predetermined position and second sensor electrode 112b located farther from the predetermined position than first sensor electrode 112a. First sensor electrode 112a is divided into two that are arranged in a direction perpendicular to the circumferential direction of steering wheel 3. First lead 112a2 of second sensor electrode 112b extends from second electrode 112b1 to the predetermined position along between the two included in first sensor electrode 112a, without being electrically connected to first sensor electrode 112a.

For example, to detect which part of the steering comes in contact with the hand of the user, sensor electrodes may be disposed at a plurality of positions. In this case, signals of the sensor electrodes are extracted from signal extractors located at a predetermined position. Here, the signal extractor of the sensor electrode, among the sensor electrodes, located away from the predetermined position may be drawn to the predetermined position along the end edge of the substrate. The plurality of sensor electrodes including the signal extractors arranged as described above and the surroundings including the substrate are sewn onto the surface layer with a sewing thread, usually along the end edge of the substrate. Thus, sewing stress is applied to the signal extractors arranged along the end edge of the substrate. The signal extractor is a lead smaller in width than the sensor electrode, and thus may be unfortunately damaged by this stress.

Moreover, continued contact with the hand of the user puts the steering under a condition of high temperature and humidity. By the contact between the hand of the user and the surface layer of the steering, moisture from, for instance, perspiration of the hand (such as moisture vapor) may penetrate from the sewed part to reach the signal extractors arranged along the end edge of the substrate. In this case, because the signal extractor having a width extremely smaller than the width of the sensor electrode is low in corrosion resistance, any corrosion may easily cause a problem to the capacitive sensor.

However, first sensor electrode 112a is divided into two that are arranged side by side in the direction perpendicular to the circumferential direction of steering wheel 3, according to the present disclosure. Second lead 112b2 of second sensor electrode 112b located farther from the predetermined position than the two included in first sensor electrode 112a is disposed along between the two included in first sensor electrode 112a. To be more specific, second lead 112b2 is interposed between the two included in first sensor electrode 112a in a central portion of substrate 113. Thus, the sewing stress hardly acts on second lead 112b2.

Moreover, second lead 112b2 is located away from the sewed part (the sewing thread). Thus, even if moisture from, for instance, perspiration of the hand of the user penetrates from the sewed part, corrosion hardly occurs to second lead 112b2.

Thus, second lead 112b2 of capacitive sensor 100b can be protected from damage and corrosion.

Sensor electrode 112 of capacitive sensor 100b is interposed between first adhesive layer 116b and second adhesive layer 116c, according to the present embodiment. Thus, moisture hardly reaches sensor electrode 112. As a result, sensor electrode 112 of capacitive sensor 100b can be further protected from corroding. Second lead 112b2 included in second sensor electrode 112b is interposed between first adhesive layer 116b and second adhesive layer 116c. Being fixed between first adhesive layer 116b and second adhesive layer 116c, second lead 112b2 resists damage when capacitive sensor 100b is to be wrapped around rim 31 of steering wheel 3. Hence, second sensor electrode 112b is capable of reliably detecting contact between surface layer 111 and the hand of the user.

As seen from a top view in which the plurality of conductive fabrics, surface layer 111, and substrate 113 of capacitive sensor 100b are laminated, a total area of the plurality of conductive fabrics is smaller than an area of surface layer 111 and than an area of substrate 113, in another aspect according to the present disclosure. The plurality of conductive fabrics are covered with first adhesive layer 116b and second adhesive layer 116c.

Thus, even if surface layer 111 is in a condition of high temperature and humidity, moisture further hardly reaches sensor electrode 112, which is covered between first adhesive layer 116a and second adhesive layer 116c. As a result, sensor electrode 112 of capacitive sensor 100b can be protected from corroding more reliably.

Capacitive sensor 100b further includes grounding electrode 114 that is disposed opposite to sensor electrode 112 across substrate 113, according to the present embodiment.

For example, in the capacitive sensor to be wrapped around the rim of the steering, a distance between grounding electrode 114 and sensor electrode 112 is smaller than a distance between conductive core bar 31b of the rim and sensor electrode 112 according to the present embodiment. Thus, a first capacitance between grounding electrode 114 and sensor electrode 112 is greater than a second capacitance between core bar 31b and sensor electrode 112. To be more specific, contact between surface layer 111 and the hand of the user is detected based on a sum of capacitance from the hand to sensor electrode 112 and capacitance from sensor electrode 112 to grounding electrode 114. This increases the sensitivity and thus further keeps the sensing accuracy of capacitive sensor 100b from deceasing.

Other Variations

Although the capacitive sensor according to the present disclosure has been described based on the above-described embodiments, the present disclosure is not limited to the embodiments. Those skilled in the art will readily appreciate that embodiments arrived at by making various modifications to the above embodiments or embodiments arrived at by selectively combining elements disclosed in the above embodiments without materially departing from the scope of the present disclosure may be included within one or more aspects of the present disclosure.

For example, for the capacitive sensor according to the embodiments described above, the steering cover includes the three sensor electrodes and the three grounding electrodes. However, the steering cover may include two or less, or four or more, sensor electrodes and two or less, or four or more, grounding electrodes. For instance, four sensor electrodes may be disposed on one substrate to increase resolution for detecting a hand-grip position on the steering wheel. Then, only two grounding electrodes may be disposed on this substrate to simplify a configuration of the grounding electrodes. Note that the number of sensor electrodes may not necessarily be the same as the number of grounding electrodes.

For example, for the capacitive sensor according to the embodiments described above, the steering cover includes the two sensor electrodes and the two grounding electrodes. However, the steering cover may include one or at least three sensor electrodes and one or at least three grounding electrodes. The number of sensor electrodes may not necessarily be the same as the number of grounding electrodes. For instance, the number of sensor electrodes may be four whereas the number of grounding electrodes may be two. In this case, the grounding electrodes may cover the two sensor electrodes as seen in a thickness direction of the substrate, for example.

The grounding electrode of the capacitive sensor according to the embodiments described above is sewn on the substrate to be fixed to the substrate. The grounding electrode may be fixed to the substrate by a different method.

Sensor electrodes 112 of the capacitive sensor according to the embodiments described above are disposed in the three locations. However, the sensor electrodes may be disposed in more locations, for example. To be more specific, if sensor electrodes 112 are disposed in four locations, first sensor electrode 112a and second sensor electrode 112b may also be disposed on the left side of FIG. 18 for left-right symmetry with respect to a predetermined position in which the signal extractors are concentrated in FIG. 18.

It should be noted that variations including various modifications made to the embodiments by those skilled in the art or any combinations of elements and functions of the embodiments are possible in the embodiments without departing from the scope of the present disclosure, in other words, the recitation in the claims.

Further Information about Technical Background to this Application

The disclosures of the following Japanese Patent Applications including specification, drawings and claims are incorporated herein by reference in their entirety: Japanese Patent Applications Nos. 2019-135006 filed on Jul. 23, 2019, 2019-135032 filed on Jul. 23, 2019, 2019-206732 filed on Nov. 15, 2019, and 2020-055778 filed on Mar. 26, 2020.

INDUSTRIAL APPLICABILITY

The capacitive sensor according to the present disclosure is applicable to a steering wheel of a vehicle or a grip of a motorcycle, for example.

The invention claimed is:
1. A capacitive sensor, comprising:
a substrate that is in a form of a sheet and has a frontside and a backside; and
a sensor electrode that is capacitive and disposed on the frontside of the substrate,
wherein the sensor electrode includes a plurality of warps each of which is a strand and a plurality of wefts each of which is a strand,
the sensor electrode is a conductive fabric made by applying a metal plating on a mesh fabric, the mesh fabric being woven of the plurality of warps and the plurality of wefts, the mesh fabric having openings each formed by two adjacent warps among the plurality of warps and two adjacent wefts among the plurality of wefts, and
an area defined by one of (i) a maximum outside diameter of a warp among the plurality of warps in cross section along a plane perpendicular to a longitudinal direction of the warp and (ii) a maximum outside diameter of a weft among the plurality of wefts in cross section along a plane perpendicular to a longitudinal direction of the weft is smaller than an area of an opening space of each of the openings.

2. The capacitive sensor according to claim 1,
wherein the sensor electrode is bonded to the frontside of the substrate to be fixed to the substrate, and
an elongation rate of the sensor electrode obtained when only the sensor electrode is stretched is greater than an elongation rate of the substrate obtained when only the substrate is stretched.

3. The capacitive sensor according to claim 1,
wherein a direction in which the sensor electrode is stretched forms an acute angle of roughly 45 degrees with a longitudinal direction of the plurality of warps and with a longitudinal direction of the plurality of wefts.

4. The capacitive sensor according to claim 1,
wherein a direction in which the substrate is stretched forms an acute angle of roughly 45 degrees with a longitudinal direction of the plurality of warps and with a longitudinal direction of the plurality of wefts, and
the substrate is fixed to equipment in a stretched state.

5. The capacitive sensor according to claim 1,
wherein the metal plating is achieved by applying an electroless copper plating on the mesh fabric and then further applying an electrolytic nickel plating on the mesh fabric.

6. The capacitive sensor according to claim 1,
wherein a maximum width of each of the openings is smaller than a width of a human finger.

7. The capacitive sensor according to claim 1,
wherein, as seen from a top view of the sensor electrode, a first area of a contact point where the warp and the weft overlap each other is smaller than a second area that is the area of the opening space of each of the openings.

8. The capacitive sensor according to claim 1, further comprising
a control circuit that is electrically connected to the sensor electrode,
wherein the sensor electrode is disposed on a steering wheel and detects contact between a human body and the steering wheel, and
the control circuit is electrically connected to the sensor electrode via which the control circuit detects the contact between the human body and the steering wheel.

9. The capacitive sensor according to claim 1,
wherein the openings have roughly identical shapes and are arranged regularly in the longitudinal direction of the warp and the longitudinal direction of the weft.

10. The capacitive sensor according to claim 1, further comprising:
a surface layer that comes in contact with a human hand; and
a moisture-proof layer disposed on a backside of the surface layer,
wherein the sensor electrode is disposed opposite to the surface layer across the moisture-proof layer,
the substrate is disposed opposite to the moisture-proof layer across the sensor electrode,
the moisture-proof layer and the sensor electrode are bonded together with a first adhesive layer,
the sensor electrode and the substrate are bonded together with a second adhesive layer, and
the moisture-proof layer is lower in moisture permeability than the first adhesive layer and the second adhesive layer.

11. The capacitive sensor according to claim 10,
wherein each of the first adhesive layer and the second adhesive layer is a substrate-less double-stick tape.

12. The capacitive sensor according to claim 10,
wherein the moisture-proof layer has a thickness smaller than a thickness of the first adhesive layer and than a thickness of the second adhesive layer.

13. The capacitive sensor according to claim 12,
wherein, as seen from a top view in which the sensor electrode, the moisture-proof layer, and the substrate are laminated, an area of the sensor electrode is smaller than an area of the moisture-proof layer and than an area of the substrate, and
the sensor electrode is covered with the first adhesive layer and the second adhesive layer.

14. The capacitive sensor according to claim 13,
wherein the surface layer and the moisture-proof layer are bonded together with a third adhesive layer, and
an outer region of the third adhesive layer is bonded to the first adhesive layer and the second adhesive layer.

15. The capacitive sensor according to claim 14,
wherein the third adhesive layer is a substrate-less double-stick tape.

16. The capacitive sensor according to claim 10,
wherein the sensor electrode includes a plurality of conductive fabrics disposed in at least three locations along a circumferential direction of a steering wheel,
each of the plurality of conductive fabrics includes an electrode and a signal extractor extending from the electrode to a predetermined position,
the plurality of conductive fabrics includes a first conductive fabric located closer to the predetermined position and a second conductive fabric located farther from the predetermined position than the first conductive fabric is,
the first conductive fabric is divided into two that are arranged in a direction perpendicular to the circumferential direction of the steering wheel, and
the signal extractor of the second conductive fabric extends from the electrode of the second conductive fabric to the predetermined position along between the two included in the first conductive fabric, without being electrically connected to the first conductive fabric.

17. The capacitive sensor according to claim 16,
wherein, as seen from a top view in which the plurality of conductive fabrics, the surface layer, and the substrate are laminated, a total area of the plurality of conductive fabrics is smaller than an area of the surface layer and than an area of the substrate, and
the plurality of conductive fabrics are covered with the first adhesive layer and the second adhesive layer.

18. The capacitive sensor according to claim 1, further comprising
a grounding electrode that is disposed opposite to the sensor electrode across the substrate.

19. A method of manufacturing a capacitive sensor including a plurality of warps each of which is a strand and a plurality of wefts each of which is a strand, the method comprising:
applying an electroless plating on a mesh fabric, the mesh fabric being woven of the plurality of warps and the plurality of wefts, the mesh fabric having openings each formed by two adjacent warps among the plurality of warps and two adjacent wefts among the plurality of wefts;

producing a sensor electrode by applying an electrolytic plating on the mesh fabric having been applied with the electroless plating in the applying; and disposing the sensor electrode on a frontside of a substrate that is in a form of a sheet, wherein an area defined by one of (i) a maximum outside diameter of a warp among the plurality of warps in cross section along a plane perpendicular to a longitudinal direction of the warp and (ii) a maximum outside diameter of a weft among the plurality of wefts in cross section along a plane perpendicular to a longitudinal direction of the weft, is smaller than an area of an opening space of each of the openings.

\* \* \* \* \*